(12) United States Patent
Miyashita

(10) Patent No.: US 7,647,059 B2
(45) Date of Patent: Jan. 12, 2010

(54) COMMUNICATION SYSTEM

(75) Inventor: Takumi Miyashita, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 522 days.

(21) Appl. No.: 10/902,958

(22) Filed: Aug. 2, 2004

(65) Prior Publication Data

US 2005/0090274 A1 Apr. 28, 2005

(30) Foreign Application Priority Data

Oct. 24, 2003 (JP) ............................. 2003-365171

(51) Int. Cl.
  *H04B 7/00* (2006.01)
  *H04B 15/00* (2006.01)
  *H04L 12/66* (2006.01)
  *H04L 12/50* (2006.01)
  *H04Q 11/00* (2006.01)

(52) U.S. Cl. ..................... 455/502; 455/506; 455/507; 370/350; 370/365

(58) Field of Classification Search ................ 455/502, 455/506, 507; 370/350, 365
  See application file for complete search history.

(56) References Cited

U.S. PATENT DOCUMENTS

| | | | | |
|---|---|---|---|---|
| 5,493,707 | A * | 2/1996 | Kamitani | 455/127.2 |
| 5,648,787 | A * | 7/1997 | Ogot et al. | 343/826 |
| 6,771,976 | B1 * | 8/2004 | Koyama | 455/502 |
| 7,110,740 | B2 * | 9/2006 | Miyashita | 455/326 |
| 2001/0026581 | A1 * | 10/2001 | Yamanouchi et al. | 375/150 |
| 2002/0181439 | A1 * | 12/2002 | Orihashi et al. | 370/350 |

FOREIGN PATENT DOCUMENTS

| | | |
|---|---|---|
| JP | 2002-084136 | 3/2002 |
| JP | 2002-208817 | 7/2002 |
| JP | 2003-152594 | 5/2003 |
| JP | 2003-204224 | 7/2003 |

* cited by examiner

Primary Examiner—Matthew D Anderson
Assistant Examiner—Bobbak Safaipour
(74) Attorney, Agent, or Firm—Arent Fox LLP

(57) ABSTRACT

A communication system in which circuits for generating transmitting-end synchronizing signals and receiving-end synchronizing signals can be realized easily even in the case of a data transmission rate being high and in which power consumption is low. A transmitting-end synchronizing signal selector in a transmitter selects one of a plurality of transmitting-end synchronizing signals with different phases outputted from a transmitting-end synchronizing signal generator on the basis of code-spread data to be transmitted. A transmitting-end signal output unit outputs a radio signal in synchronization with the selected transmitting-end synchronizing signal. A receiving-end synchronizing signal selector in a receiver selects one of a plurality of receiving-end synchronizing signals which are outputted from a receiving-end synchronizing signal generator and which are the same as the plurality of transmitting-end synchronizing signals on the basis of a despreading code. A receiving-end signal output unit outputs a correlation-detected signal which is synchronized with the selected receiving-end synchronizing signal and with which the correlation of the radio signal is detected. A correlator detects a correlation between the radio signal transmitted from the transmitter and the correlation-detected signal.

5 Claims, 28 Drawing Sheets

COMMUNICATION SYSTEM

CROSS-REFERENCE TO RELATED APPLICATIONS

This application is based upon and claims the benefits of priority from the prior Japanese Patent Application No. 2003-365171, filed on Oct. 24, 2003, the entire contents of which are incorporated herein by reference.

BACKGROUND OF THE INVENTION (1) Field of the Invention

This invention relates to a communication system and, more particularly, to a communication system for performing UWB communication.

(2) Description of the Related Art

Currently, the operation speed of CPUs used in electronics has progressively increased. If the operation speed (frequency) of CPUs used in electronics for radio communication becomes approximately equal to a radio communication frequency, then they will interfere with each other. Accordingly, electronics for radio communication must use radio signals at higher frequencies.

The frequency bands of 3.1 to 10.6 GHz (microwave) and 22 to 29 GHz (sub-millimeter wave) are allocated for ultra-wide band (UWB) communication and probing in which a bandwidth ratio (bandwidth/center frequency) is higher than or equal to 20% or in which a bandwidth wider than or equal to 500 MHz is used. The UWB techniques will also be used in a milliwave band in the future.

A bandwidth ratio is high in the microwave band. This enables communication in which the hopping of the time when a single cycle pulse occurs is performed without using a carrier wave. A bandwidth to center frequency ratio is low in the sub-millimeter wave or millimeter wave band compared to microwave UWB band, so a wave train of several to several hundred waves can be used instead of a single cycle pulse in the microwave UWB monocycle system.

FIG. 27 is a block diagram of a UWB transmitter for performing direct sequence spread spectrum communication. A code spreader 142 spreads data to be transmitted by the use of a spreading code outputted from a code generator 141 and sends it to a waveform generator 143. The waveform generator 143 generates a single cycle pulse or a burst waveform on the basis of the spread data to be transmitted. A band pass filter (BPF) 144 takes only a predetermined band from the single cycle pulse or the burst waveform. The predetermined band is transmitted from an antenna 145.

FIG. 28 is a block diagram of a UWB receiver for performing direct sequence spread spectrum communication. Only a permissible band of the UWB signal received by an antenna 151 is outputted to a pulse correlator 153 via a BPF 152. On the other hand, a code spreader 155 generates a spreading signal from a code generated by a code generator 154. A waveform generator 156 generates a received waveform template corresponding to the spreading signal. The pulse correlator 153 detects a correlation between the received waveform template and the received signal. (With binary phase shift keying (BPSK), there is a non-inverted or inverted correlation between the template and the received signal over the entire length of the spreading code. Therefore, after the pulse correlation detection a positive or negative correlation signal is obtained by performing integration over each code interval.) A pulse train integrator 157 calculates an integration value for the received signal in each code interval. A comparator 158 takes demodulated data on the basis of whether the integration value is positive or negative.

The code spreaders and the waveform generators in the transmitter and the receiver must operate at a clock frequency given by (data transmission rate×spreading code length/number of modulated bits). For example, if a data transfer rate is 500 Mbps, spreading code length is 64 bits, and the number of modulated bits is one, then the code spreaders and the waveform generators must operate at a clock frequency of 3.2 GHz.

An oscillation circuit capable of generating multiphase clocks, such as two-phase clocks, which have a certain phase difference and a stable frequency and in which phase noise is low without dividing a high source oscillation frequency or using many phase shifters is disclosed (see, for example, Japanese Unexamined Patent Publication No. 2002-208817, paragraph nos. [0011]-[0021] and FIGS. 1-4).

SUMMARY OF THE INVENTION

In the present invention, a communication system comprising a transmitter including a code spreader for performing code spreading on data to be transmitted, a transmitting-end synchronizing signal generator for generating a plurality of transmitting-end synchronizing signals with different phases on which the timing of the outputting of a radio signal is based, a transmitting-end synchronizing signal selector for selecting one of the plurality of transmitting-end synchronizing signals on the basis of the code-spread data to be transmitted, and a transmitting-end signal output unit for outputting the radio signal in synchronization with the selected transmitting-end synchronizing signal and a receiver including a code output unit for outputting a despreading code for performing despreading on the radio signal, a receiving-end synchronizing signal generator for generating a plurality of receiving-end synchronizing signals which are the same as the plurality of transmitting-end synchronizing signals, a receiving-end synchronizing signal selector for selecting one of the plurality of receiving-end synchronizing signals on the basis of the despreading code, a receiving-end signal output unit for outputting a correlation-detected signal which is synchronized with the selected receiving-end synchronizing signal and with which the correlation of the radio signal is detected, and a correlator for detecting a correlation between the radio signal and the correlation-detected signal is provided.

The above and other features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1:
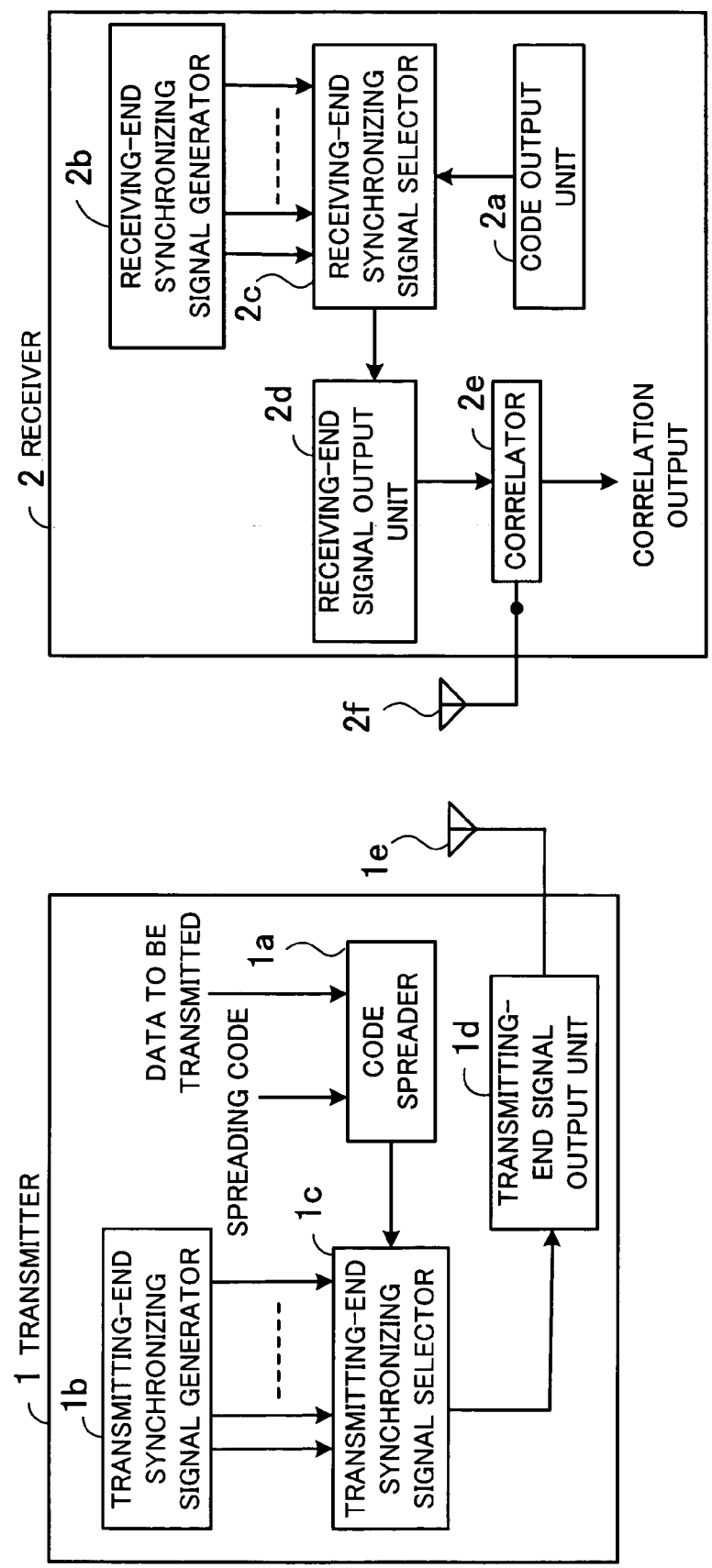
FIG. 1 is a view for describing the principles underlying a communication system according to the present invention.

Each of transmitters and receivers includes a circuit for generating a synchronizing signal used for determining timing with which a radio signal of a single cycle pulse or a burst wave is outputted. A high data transfer rate will make it difficult to realize a synchronizing signal generation circuit and result in an increase in power consumption.

The present invention was made in order to solve such problems. An object of the present invention is to provide a communication system in which a synchronizing signal generation circuit can be realized easily even in the case of a high data transfer rate and which can control an increase in power consumption.

The principles underlying the present invention will now be described with reference to the drawing.

FIG. 1 is a view for describing the principles underlying a communication system according to the present invention.

A transmitter 1 shown in FIG. 1 includes a code spreader $1a$, a transmitting-end synchronizing signal generator $1b$, a transmitting-end synchronizing signal selector $1c$, a transmitting-end signal output unit $1d$, and an antenna $1e$. A receiver 2 includes a code output unit $2a$, a receiving-end synchronizing signal generator $2b$, a receiving-end synchronizing signal selector $2c$, a receiving-end signal output unit $2d$, a correlator $2e$, and an antenna $2f$.

A spreading code and data to be transmitted are inputted to the code spreader $1a$ in the transmitter 1. The code spreader $1a$ spreads the data to be transmitted by the use of the spreading code and outputs the spread data to the transmitting-end synchronizing signal selector $1c$.

The transmitting-end synchronizing signal generator $1b$ generates a plurality of transmitting-end synchronizing signals with different phases.

The transmitting-end synchronizing signal selector $1c$ selects one of the plurality of transmitting-end synchronizing signals outputted from the transmitting-end synchronizing signal generator $1b$ on the basis of the signal to be transmitted code-spread by the code spreader $1a$.

The transmitting-end signal output unit $1d$ outputs the radio signal to the antenna $1e$ in synchronization with the transmitting-end synchronizing signal selected by the transmitting-end synchronizing signal selector $1c$.

The code output unit $2a$ in the receiver 2 outputs a despreading code for despreading the radio signal transmitted from the transmitter 1 and received by the antenna $2f$.

The receiving-end synchronizing signal generator $2b$ generates a plurality of receiving-end synchronizing signals the frequencies and phases of which are the same as those of the plurality of transmitting-end synchronizing signals generated by the transmitting-end synchronizing signal generator $1b$ in the transmitter 1.

The receiving-end synchronizing signal selector $2c$ selects and outputs one of the plurality of receiving-end synchronizing signals outputted from the receiving-end synchronizing signal generator $2b$ on the basis of the despreading code outputted from the code output unit $2a$.

The receiving-end signal output unit $2d$ outputs a correlation-detected signal which is synchronized with the receiving-end synchronizing signal selected by the receiving-end synchronizing signal selector $2c$ and with which the correlation of the radio signal is detected.

The correlator $2e$ detects a correlation between the radio signal received by the antenna $2f$ and the correlation-detected signal outputted from the receiving-end signal output unit $2d$.

Operation in FIG. 1 will now be described.

The transmitting-end synchronizing signal generator $1b$ in the transmitter 1 generates the plurality of transmitting-end synchronizing signals with different phases. The transmitting-end signal output unit $1d$ outputs the radio signal in synchronization with the transmitting-end synchronizing signal selected on the basis of the code-spread data to be transmitted. The transmitting-end signal output unit $1d$ outputs the radio signal in synchronization with the selected transmitting-end synchronizing signal. Therefore, radio signals with different phases corresponding to the code-spread data to be transmitted are outputted from the transmitting-end signal output unit $1d$.

The receiving-end synchronizing signal generator $2b$ in the receiver 2 generates the plurality of receiving-end synchronizing signals which are the same as the plurality of transmitting-end synchronizing signals. The receiving-end signal output unit $2d$ outputs the correlation-detected signal which is synchronized with the receiving-end synchronizing signal selected on the basis of the despreading code and with which the correlation of the radio signal is detected. Therefore, correlation-detected signals with different phases corresponding to the despreading code are outputted from the receiving-end signal output unit $2d$.

The correlator $2e$ detects a correlation between the radio signal received by the antenna $2f$ and the correlation-detected signal outputted from the receiving-end signal output unit $2d$. If the waveforms of the radio signal received by the antenna $2f$ and the correlation-detected signal outputted from the receiving-end signal output unit $2d$ match, then a great correlation value will be obtained. Output from the correlator $2e$ is integrated over one symbol period and it is judged whether the result is one or zero. By doing so, received data is obtained.

As stated above, in the transmitter one of the plurality of transmitting-end synchronizing signals with different phases is selected on the basis of the code-spread data to be transmitted and the radio signal is transmitted in synchronization with the selected transmitting-end synchronizing signal. In the receiver one of the plurality of receiving-end synchronizing signals with different phases is selected on the basis of the despreading code and the radio signal is received in synchronization with the selected receiving-end synchronizing signal. Therefore, even if a data transfer rate is high, there is no need to increase the frequencies of a transmitting-end synchronizing signal and a receiving-end synchronizing signal. As a result, a synchronizing signal generation circuit can be realized easily and power consumption can be controlled.

A communication system according to a first embodiment of the present invention will now be described in detail with reference to the drawings. This communication system includes a transmitter and a receiver and the transmitter will be described first.

Figure 2:
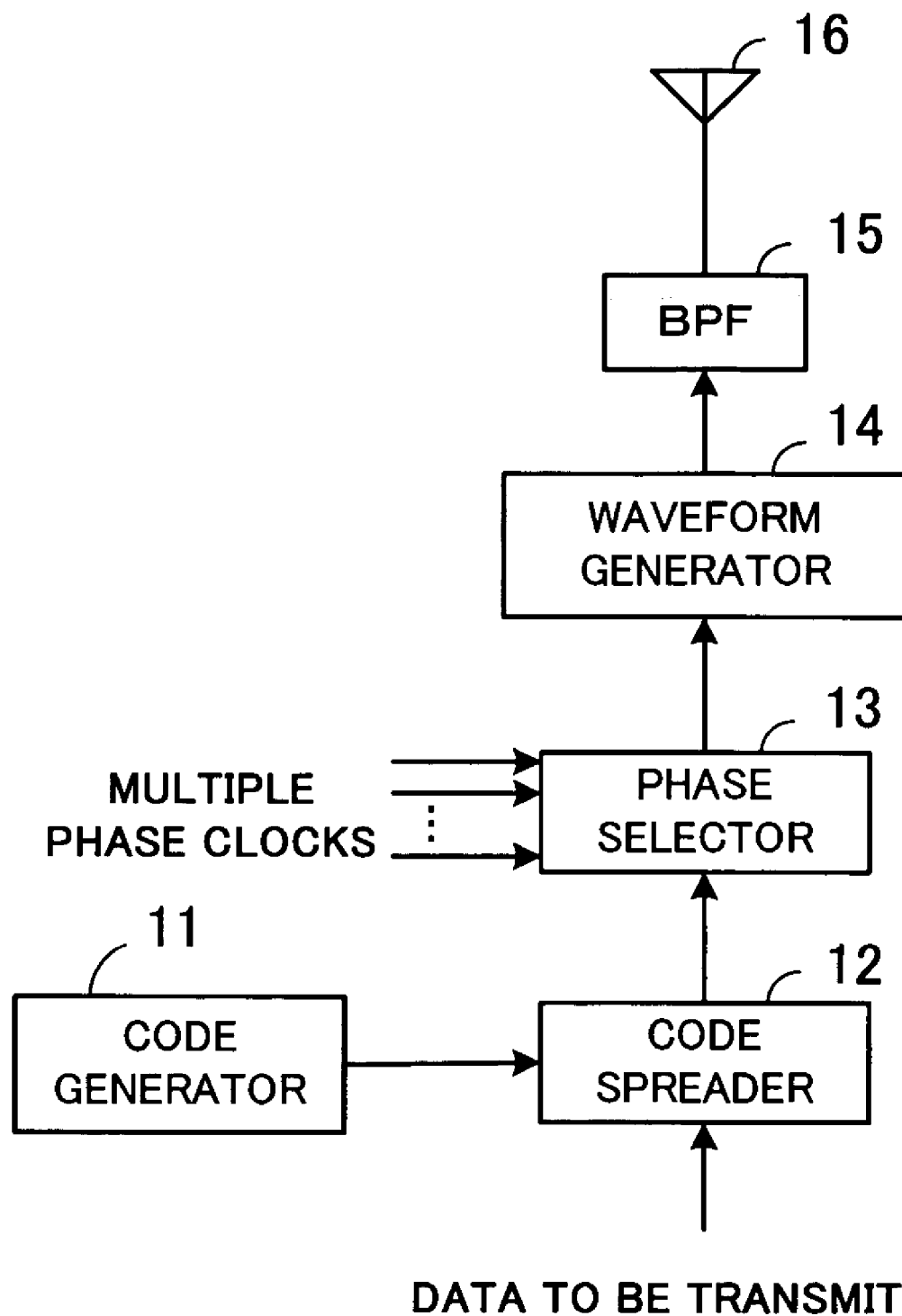
FIG. 2 is a block diagram of a transmitter.

FIG. 2 is a block diagram of the transmitter.

As shown in FIG. 2, the transmitter includes a code generator 11, a code spreader 12, a phase selector 13, a waveform generator 14, a BPF 15, and an antenna 16. For example, the transmitter performs UWB communication in which a carrier wave is not needed in the millimeter wave band.

The code generator 11 outputs a spreading code for code-spreading data to be transmitted.

The data to be transmitted and the spreading code outputted from the code generator 11 are inputted to the code spreader 12. The code spreader 12 spreads the inputted data to be transmitted with the spreading code and outputs the code-spread data to be transmitted.

A plurality of clocks with different phases, being multiple phase clocks, and the code-spread data to be transmitted outputted from the code spreader 12 are inputted to the phase selector 13. The phase selector 13 selects one of the multiple phase clocks inputted on the basis of the code-spread data to be transmitted and outputs it to the waveform generator 14.

The waveform generator 14 outputs a single cycle pulse synchronized with the clock selected by the phase selector 13. Single cycle pulses with different phases corresponding to the code-spread data to be transmitted are outputted from the waveform generator 14, so information given by the data to be transmitted will be included in the phases of the single cycle pulses.

The BPF 15 allows only a permissible band of the single cycle pulse signal outputted from the waveform generator 14 to pass and outputs it to the antenna 16.

A circuit which forms each block in FIG. 2 will now be described. A circuit which forms the waveform generator 14 will be described first.

Figure 3:
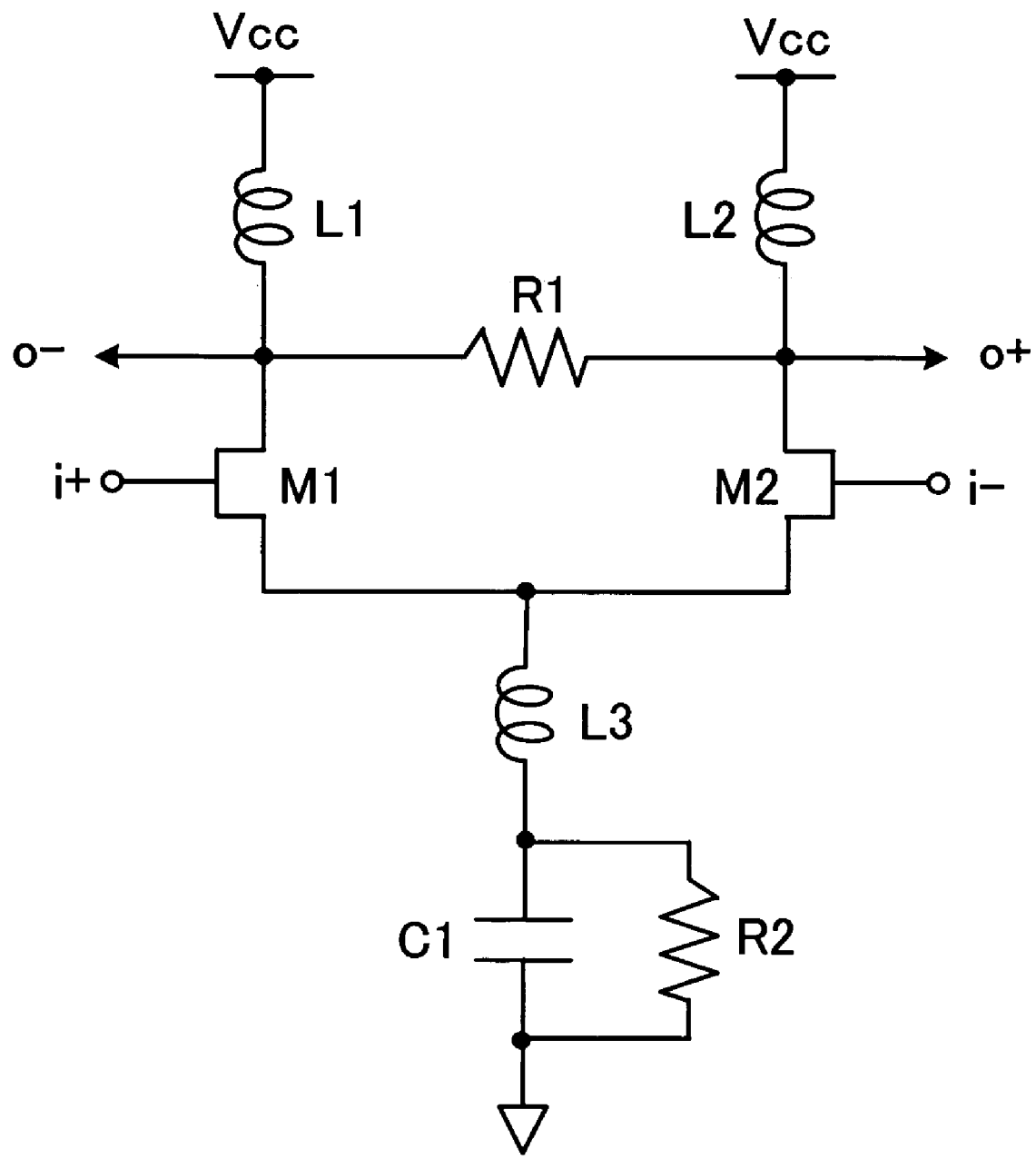
FIG. 3 is a circuit diagram of a single cycle generator.

FIG. 3 is a circuit diagram of a single cycle generator.

A single cycle generator shown in FIG. 3 is located as the waveform generator 14 shown in FIG. 2 and outputs a signal as a basis for modulating spread data to be transmitted.

As shown in FIG. 3, the single cycle generator includes transistors M1 and M2, resistors R1 and R2, a condenser C1, and inductors L1 through L3.

A drain of the transistor M1 is connected to one end of the inductor L1 the other end of which is connected to a power supply Vcc. A drain of the transistor M2 is connected to one end of the inductor L2 the other end of which is connected to the power supply Vcc. The drains of the transistors M1 and M2 are connected via the resistor R1. Sources of the transistors M1 and M2 are connected to the inductor L3. The condenser C1 and the resistor R2 are connected in parallel. One end of each of the condenser C1 and the resistor R2 is connected to the inductor L3 and the other end of each of the condenser C1 and the resistor R2 is connected to a ground.

By considering the inductors L1 and L2 as loads and using mutual inductance between them, the single cycle generator becomes differential. If a high frequency is needed, then a stub with a length equal to a fourth of the wavelength corresponding to the center frequency is used. One of the multiple phase clocks selected and outputted by the phase selector 13 is inputted to gates of the transistors M1 and M2 included in the single cycle generator. The single cycle generator outputs the clock input signals i+ and i− inputted to the gates of the transistors M1 and M2 from the drains of the transistors M1 and M2 as an output signals o− and o+, respectively, of a single cycle pulse (impulse). The frequency of the output signals o+ and o− depends on a series resonance circuit including the inductor L3 and a parallel circuit made up of the condenser C1 and the resistor R2.

Figure 4:
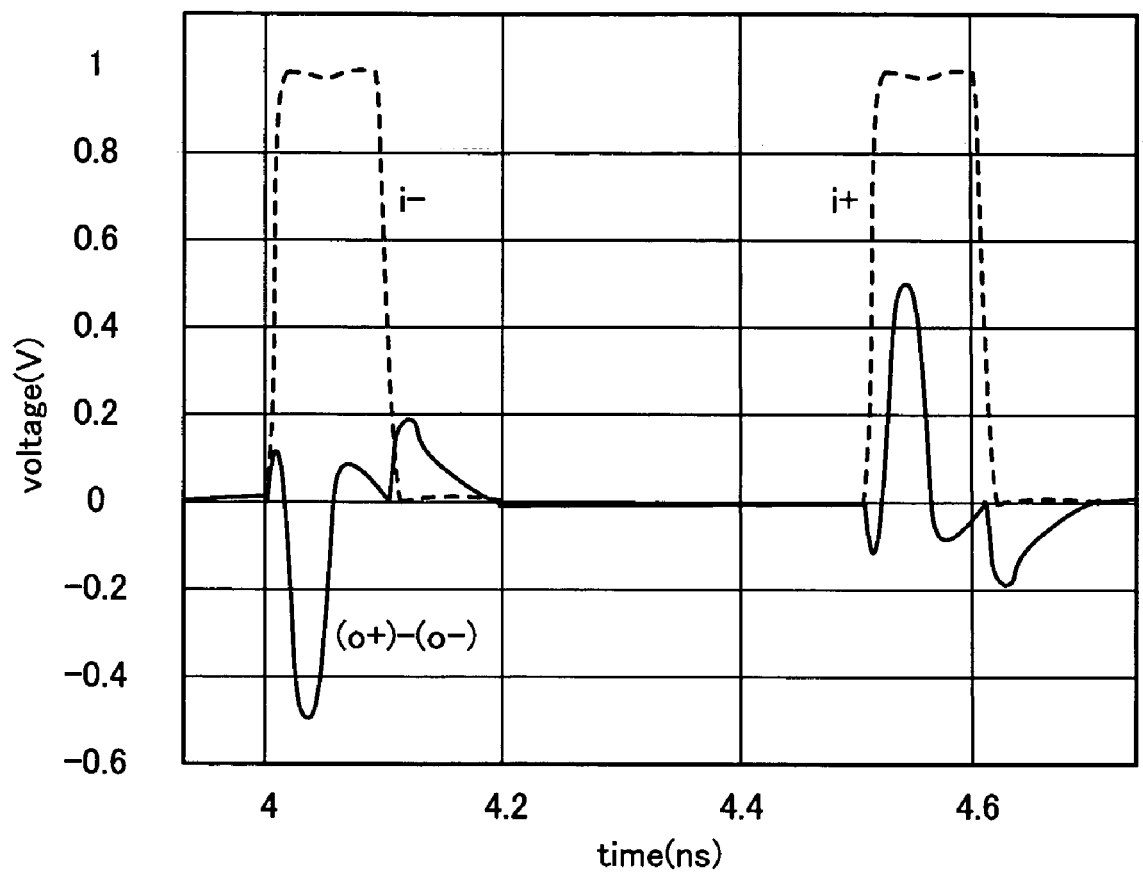
FIG. 4 shows the waveforms of input to and output from the single cycle generator.

FIG. 4 shows the waveforms of input to and output from the single cycle generator.

The horizontal axis of a graph shown in FIG. 4 indicates time in ns. The vertical axis of the graph indicates voltage in volts. Dotted lines shown in FIG. 4 indicate the input signals i+ and i− inputted to the gates of the transistors M1 and M2 respectively. A solid line shown in FIG. 4 indicates a waveform corresponding to the differential ((o+)−(o−)) between the output signals o+ and o− taken from the drains of the transistors M2 and M1 respectively. As shown in FIG. 4, the output signals o+ and o− of a single cycle pulse are outputted in synchronization with the clock input signals i+ and i−.

A circuit for outputting multiple phase clocks will now be described.

Figure 5:
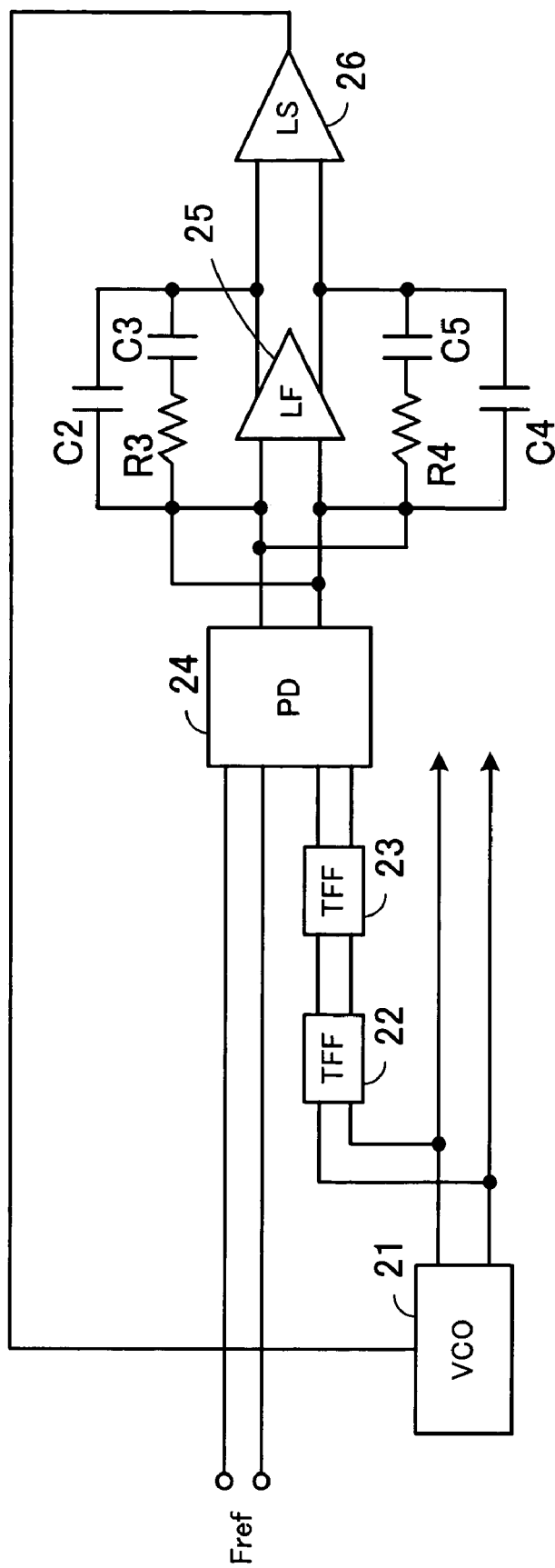
FIG. 5 is a block diagram of a PLL.

FIG. 5 is a block diagram of a PLL.

As shown in FIG. 5, a phase locked loop (PLL) includes a voltage controlled oscillator (VCO) 21, T flip-flops (TFFs) 22 and 23, a phase detector (PD) 24, a loop filter (LF) 25, and a level shifter (LS) 26. In addition, the PLL includes resistors R3 and R4 and condensers C2 through C5. The PLL shown in FIG. 5 outputs a signal having a frequency four times the frequency of a reference signal Fref.

Voltage outputted from the PLL (voltage outputted from the level shifter 26) is inputted to the voltage controlled oscillator 21 and is used for controlling an oscillation frequency.

The TFFs 22 and 23 divide the frequency of a signal outputted from the VCO 21. Each of the TFFs 22 and 23 divides the frequency of the signal inputted thereto in two. Accordingly, the frequency of the signal outputted from the TFF 23 is a fourth of the frequency of the signal inputted to the TFF 22.

The reference signal Fref having a reference frequency and the signal outputted from the TFF 23 are inputted to the phase detector 24. The phase detector 24 detects difference between the phase of the signal outputted from the TFF 23 and the phase of the reference signal Fref and outputs a pulse signal with a pulse width proportional to the phase difference.

The loop filter 25 blocks a high frequency band of the pulse signal outputted from the phase detector 24 and converts the phase difference outputted from the phase detector 24 into a voltage value. A lag-lead filter is formed by a circuit in which the resistor R3 and the condenser C3 connected in series and the condenser C2 are connected in parallel and a circuit in which the resistor R4 and the condenser C5 connected in series and the condenser C4 are connected in parallel between the input side and the output side of the loop filter 25.

The level shifter 26 converts the voltage outputted from the loop filter 25 into an appropriate voltage level and outputs it to the voltage controlled oscillator 21.

By the way, the scale of circuits which make up the frequency dividers (TFFs 22 and 23) is large and high speed operation is required especially at the first stage. Therefore, a PLL which includes no frequency dividers and which directly compares the phases of a signal having a frequency equal to a fourth of a frequency generated by the voltage controlled oscillator 21 and a reference signal will now be described.

Figure 6:
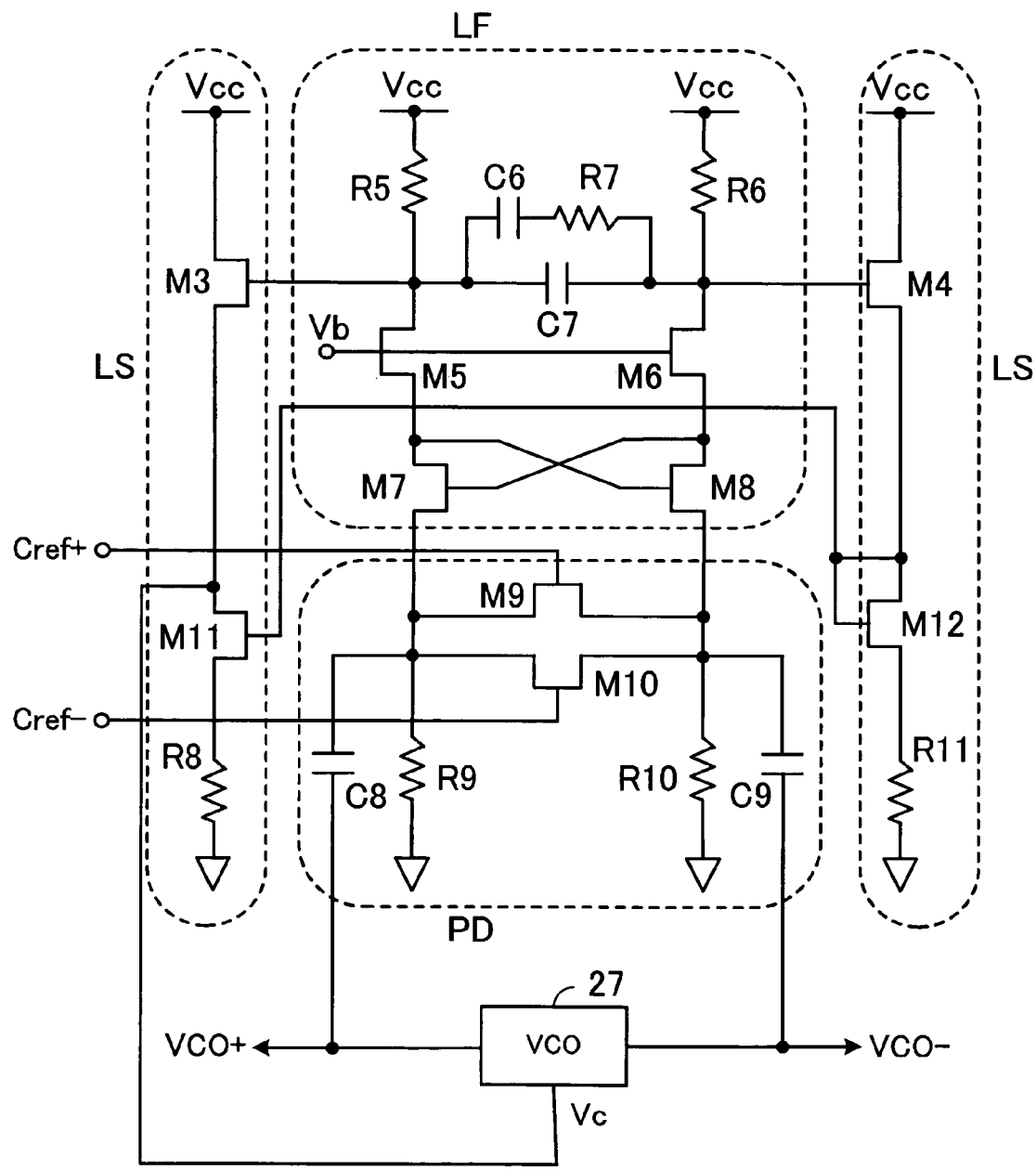
FIG. 6 is a circuit diagram of a PLL including no frequency dividers.

FIG. 6 is a circuit diagram of a PLL including no frequency dividers.

As shown in FIG. 6, a PLL includes resistors R5 through R11, condensers C6 through C9, and transistors M3 through M12.

A signal VCO+ outputted from a voltage controlled oscillator (VCO) 27 is inputted to drains of the transistors M9 and M10 via the condenser C8. A signal VCO− outputted from the voltage controlled oscillator (VCO) 27 is inputted to sources of the transistors M9 and M10 via the condenser C9. The drains of the transistors M9 and M10 are connected to one end of the resistor R9 the other end of which is connected to a ground. The sources of the transistors M9 and M10 are connected to one end of the resistor R10 the other end of which is connected to the ground. A reference signal Cref+ having a reference frequency is inputted to a gate of the transistor M9. A reference signal Cref− having the reference frequency is inputted to a gate of the transistor M10.

The transistors M9 and M10, the resistors R9 and R10, and the condensers C8 and C9 make up a phase detector (PD in FIG. 6). The phase detector detects difference in phase between the reference signals Cref+ and Cref− and the signals VCO+ and VCO− outputted from the voltage controlled oscillator 27 and outputs a pulse signal with a pulse width proportional to the phase difference.

A drain of the transistor M5 is connected to one end of the resistor R5 the other end of which is connected to a power supply Vcc. A drain of the transistor M6 is connected to one end of the resistor R6 the other end of which is connected to the power supply Vcc. A circuit in which the condenser C6 and the resistor R7 connected in series and the condenser C7 are connected in parallel is inserted between the drains of the transistors M5 and M6. Sources of the transistors M5 and M6 are connected to drains of the transistors M7 and M8 respectively. A gate of the transistor M7 is connected to the drain of the transistor M8 and a gate of the transistor M8 is connected to the drain of the transistor M7. A source of the transistor M7 is connected to the drains of the transistors M9 and M10. A source of the transistor M8 is connected to the sources of the transistors M9 and M10. Bias voltage Vb is inputted to gates of the transistors M5 and M6.

The transistors M5 through M8, the resistors R5 through R7, and the condensers C6 and C7 make up a loop filter (LF in FIG. 6). The loop filter blocks a high frequency band of the pulse signal outputted from the phase detector and converts the phase difference into a voltage value.

A drain of the transistor M3 is connected to the power supply Vcc. A source of the transistor M3 is connected to a drain of the transistor M11. A gate of the transistor M3 is connected to the drain of the transistor M5 included in the loop filter. A source of the transistor M11 is connected to one end of the resistor R8 the other end of which is connected to the ground. A gate of the transistor M11 is connected to a gate and a drain of the transistor M12.

A drain of the transistor M4 is connected to the power supply Vcc. A source of the transistor M4 is connected to a drain of the transistor M12. A gate of the transistor M4 is connected to the drain of the transistor M6 included in the loop filter. A source of the transistor M12 is connected to one end of the resistor R11 the other end of which is connected to the ground.

The transistors M3, M4, M11 and M12 and the resistors R8 and R11 make up a level shifter (LS in FIG. 6). The level shifter converts the voltage outputted from the loop filter into an appropriate voltage level Vc and outputs it to the voltage controlled oscillator 27.

The voltage controlled oscillator 27 controls an oscillation frequency on the basis of the voltage Vc outputted from the level shifter and outputs the signals VCO+ and VCO−.

The voltage controlled oscillator 27 may be a balanced voltage controlled oscillator or a multi-phase voltage controlled oscillator. A balanced voltage controlled oscillator will be described first.

Figure 7:
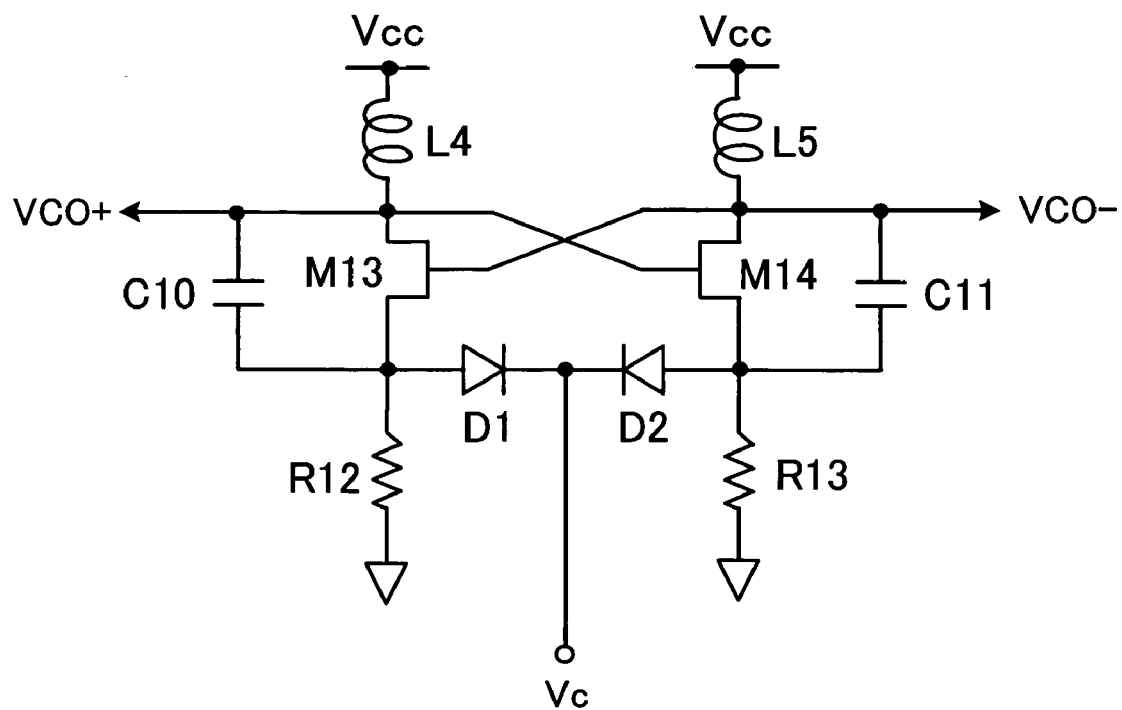
FIG. 7 is a circuit diagram of a balanced voltage controlled oscillator.

FIG. 7 is a circuit diagram of a balanced voltage controlled oscillator.

As shown in FIG. 7, a voltage controlled oscillator includes transistors M13 and M14, resistors R12 and R13, condensers C10 and C11, inductors L4 and L5, and diodes D1 and D2.

A drain of the transistor M13 is connected to one end of the inductor L4 the other end of which is connected to the power supply Vcc. A drain of the transistor M14 is connected to one end of the inductor L5 the other end of which is connected to the power supply Vcc. A source of the transistor M13 is connected to one end of the resistor R12 the other end of which is connected to the ground. A source of the transistor M14 is connected to one end of the resistor R13 the other end of which is connected to the ground. A gate of the transistor M13 is connected to the drain of the transistor M14 and a gate of the transistor M14 is connected to the drain of the transistor M13.

The condenser C10 is located between the drain and the source of the transistor M13 and the condenser C11 is located between the drain and the source of the transistor M14.

An anode of the diode D1 is connected to the source of the transistor M13. An anode of the diode D2 is connected to the source of the transistor M14. Cathodes of the diodes D1 and D2 are connected to each other and the voltage Vc outputted from the level shifter is inputted to these cathodes. The signals VCO+ and VCO− having a frequency which depends on the voltage Vc are outputted from the drains of the transistors M13 and M14 respectively. The diodes D1 and D2 are varactor diodes.

A multi-phase voltage controlled oscillator will now be described.

Figure 8:
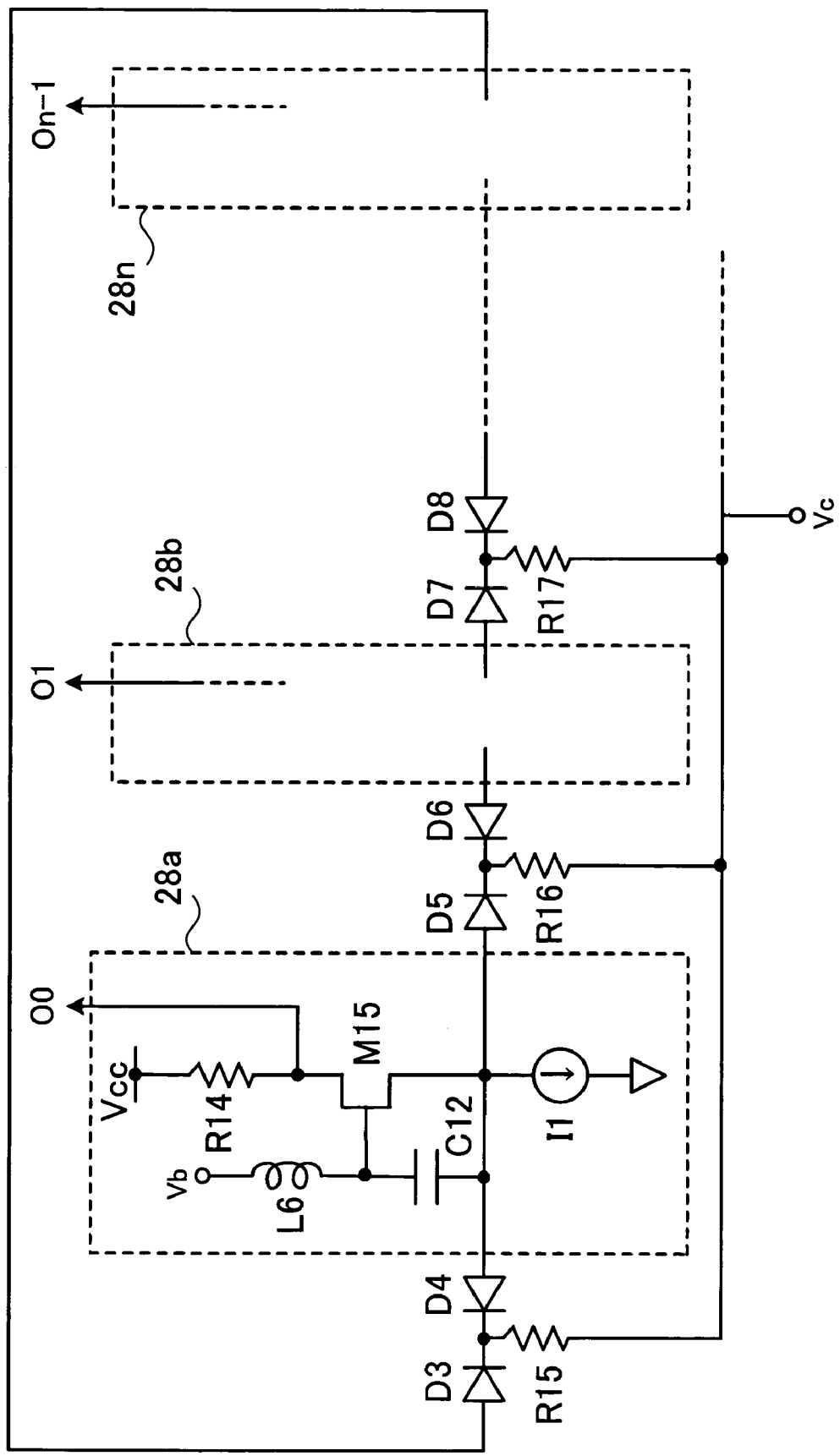
FIG. 8 is a circuit diagram of a multi-phase voltage controlled oscillator.

FIG. 8 is a circuit diagram of a multi-phase voltage controlled oscillator.

As shown in FIG. 8, a multi-phase voltage controlled oscillator includes circuits 28a through 28n. The circuits 28a through 28n are connected to one another via diodes D3 and D4 and a resistor R15, diodes D5 and D6 and a resistor R16, diodes D7 and D8 and a resistor R17, and so on.

The circuit 28a includes a transistor M15, a resistor R14, an inductor L6, a condenser C12, and a current source I1. A drain of the transistor M15 is connected to one end of the resistor R14 the other end of which is connected to the power supply Vcc. A source of the transistor M15 is connected to one end of the current source I1 the other end of which is connected to the ground. A gate of the transistor M15 is connected to a point where the inductor L6 and the condenser C12 are connected in series. The bias voltage Vb is inputted to a terminal of the inductor L6 where the condenser C12 is not connected. A terminal of the condenser C12 where the inductor L6 is not connected is connected to the source of the transistor M15. The structure (not shown) of the circuits 28b through 28n is the same as that of the circuit 28a.

The voltage Vc outputted from the level shifter is inputted to the circuits 28a through 28n via the resistors R15, R16, R17, and so on and the diodes D3, D4, D5, D6, D7, D8, and soon. The circuits 28a through 28n output multiple phase clocks O0, O1, ..., On–1, respectively, with different phases the frequency of which depends on the voltage Vc. The multiple phase clocks O0, O1, ..., On–1 are used for synchronizing radio signals. Therefore, the frequency of the multiple phase clocks O0, O1, ..., On–1 may be lower than the center frequency of the radio signals, but it must be higher than the frequency corresponding to the timing with which the radio signals are outputted.

By using the balanced voltage controlled oscillator shown in FIG. 7 and the multi-phase voltage controlled oscillator shown in FIG. 8 as the voltage controlled oscillator 27 shown in FIG. 6, multiple phase clocks can be generated. To be concrete, the frequency (62.5 MHz, for example) of TCXO output (signal outputted from a crystal oscillator) is multiplied four times by a PLL including the balanced voltage controlled oscillator to obtain an internal balanced reference frequency of 250 MHz. Furthermore, this frequency is multiplied four times by a PLL including the multi-phase voltage controlled oscillator to obtain multiple phase clocks at a frequency of 1 GHz.

The circuits shown in FIGS. 6 through 8 can be formed on a unitary semiconductor substrate, so the area of a substrate and power consumption can be reduced.

Desired multiple phase clocks may be obtained by the PLL including the multi-phase voltage controlled oscillator without using the PLL including the balanced voltage controlled oscillator.

The phase selector 13 will now be described.

Figure 9:
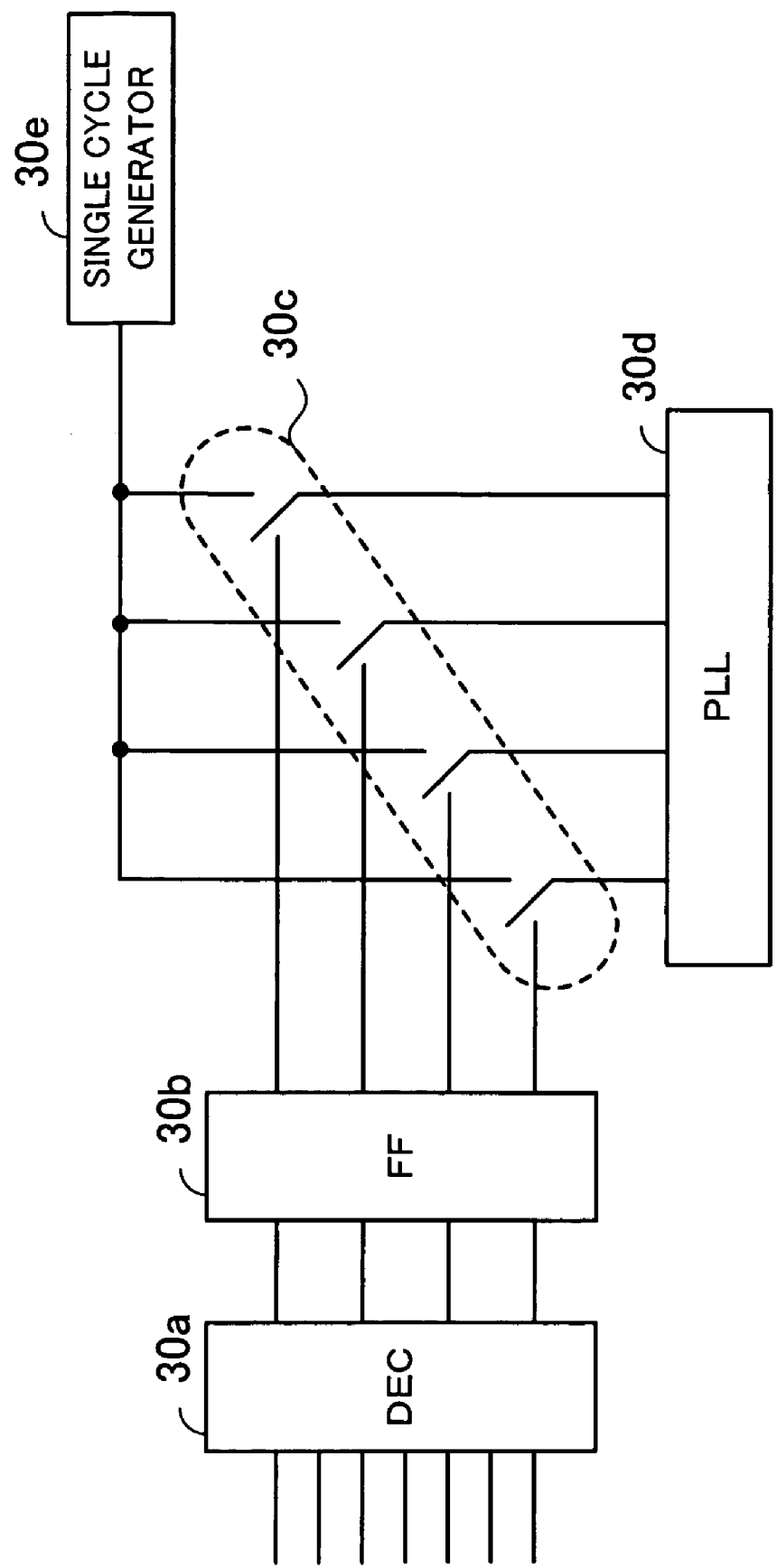
FIG. 9 is a circuit diagram of a phase selector.

FIG. 9 is a circuit diagram of the phase selector.

As shown in FIG. 9, the phase selector 13 includes a decoder (DEC) 30a, a flip-flop circuit (FF) 30b, and a selector 30c. In addition, a PLL 30d described in FIGS. 6 through 8 and a single cycle generator 30e described in FIG. 3 are shown in FIG. 9.

The code-spread data to be transmitted outputted from the code spreader 12 is inputted to the decoder 30a. The decoder 30a outputs a signal for turning on/off switches in the selector 30c to the flip-flop circuit 30b on the basis of the code-spread data to be transmitted.

The PLL 30d outputs multiple phase clocks to the selector 30c. The PLL 30d also outputs two of the multiple phase clocks to the flip-flop circuit 30b.

The flip-flop circuit 30b inputs the signal outputted from the decoder 30a when one of the two multiple phase clocks is inputted. The flip-flop circuit 30b settles the input of the signal outputted from the decoder 30a when the other of the two multiple phase clocks is inputted. The flip-flop circuit 30b can input or output the signal reliably with timing given by the multiple phase clocks with different phases.

The selector 30c includes a plurality of switches. The selector 30c turns on/off these switches in response to the signal outputted from the flip-flop circuit 30b and outputs one of the multiple phase clocks outputted from the PLL 30d to the single cycle generator 30e.

As described above, in the phase selector one of the multiple phase clocks outputted from the PLL 30d is selected on the basis of the code-spread data to be transmitted and is outputted to the single cycle generator 30e. A single cycle pulse synchronized with the selected multiple phase clock is outputted from the single cycle generator 30e. The single cycle pulse is outputted to the BPF 15 shown in FIG. 2 and is transmitted to the receiver via the antenna 16.

A convolver will now be described.

Figure 10:
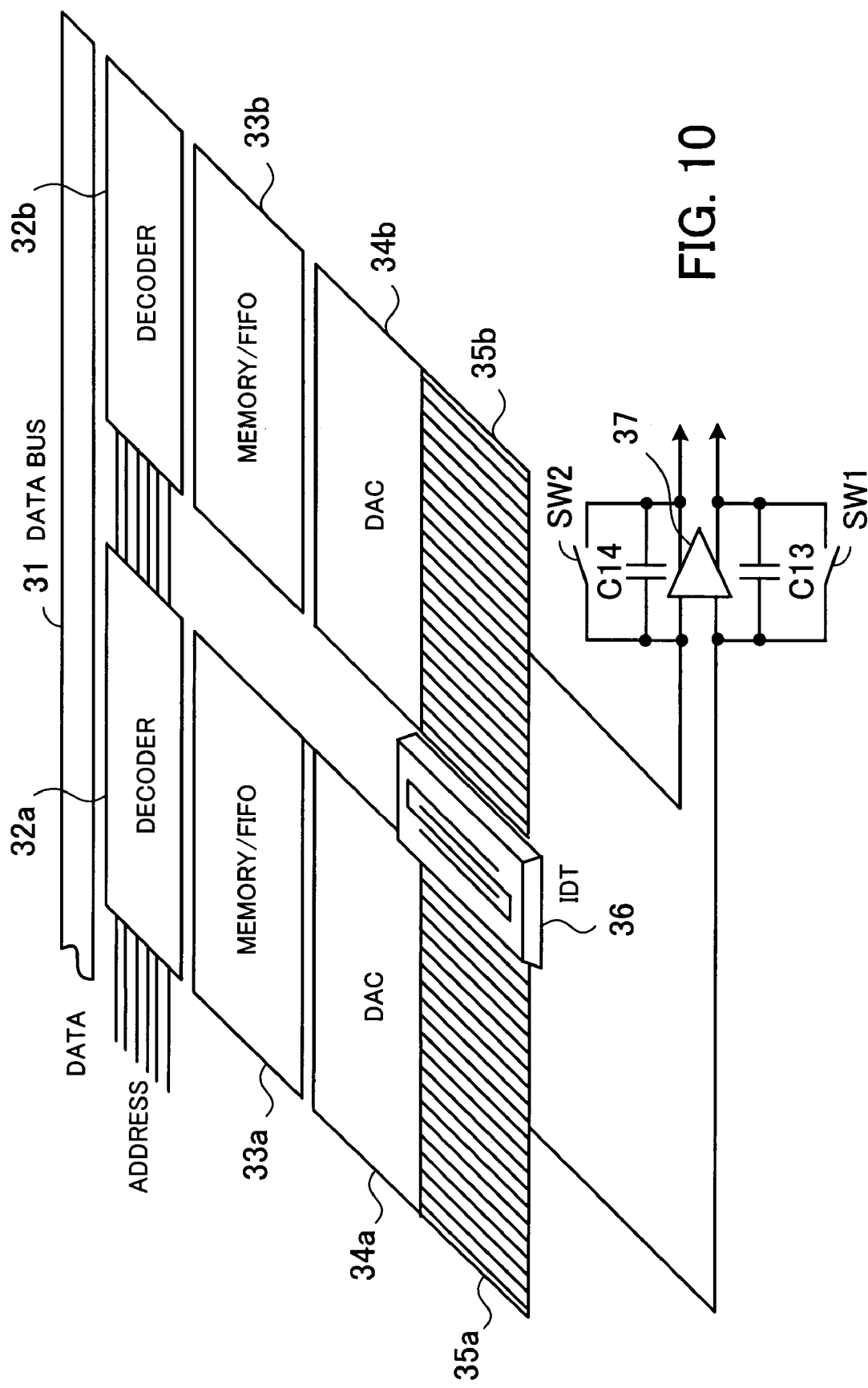
FIG. 10 shows the structure of a convolver.

FIG. 10 shows the structure of a convolver.

As shown in FIG. 10, a convolver includes a data bus 31, decoders 32a and 32b, memories (first-in first-out (FIFO) memories) 33a and 33b, digital-analog converters (DACs) 34a and 34b, conductive sections 35a and 35b, and an interdigital transducer (IDT) 36. An integration circuit made up of an amplifier 37, condensers C13 and C14, and switches SW1 and SW2 is connected to the output side of the conductive sections 35a and 35b.

A first signal is outputted to the data bus 31 and an address is outputted to the decoders 32a and 32b. When the decoders 32a and 32b are selected by the address, the decoders 32a and 32b output the first signal outputted to the data bus 31 to the memories 33a and 33b respectively. The memories 33a and 33b hold the first signal outputted from the decoders 32a and 32b respectively and output it to the DACs 34a and 34b respectively. The DACs 34a and 34b convert a voltage value in each bit included in the first signal outputted from the memories 33a and 33b respectively into an analog value and output it to the conductive sections 35a and 35b respectively.

A plurality of strain resistance elements (strain resistance stripes) are formed in the conductive sections 35a and 35b and voltage outputted from the DACs 34a and 34b is inputted to these strain resistance elements.

A second signal is inputted to the IDT 36. The second signal inputted to the IDT 36 propagates through the conductive sections 35a and 35b perpendicularly to the strain resistance stripes as a surface acoustic wave. As the distance from the IDT 36 increases, the surface acoustic wave will attenuate. Accordingly, a digital or analog correction can be made to a voltage value in each bit included in the first signal in the DACs 34a and 34b so that as the distance on the conductive sections 35a and 35b from the IDT 36 increases, the voltage value will become greater.

The conductive section 35a is located on one side of the IDT 36 and the conductive section 35b is located on the other side of the IDT 36. The DAC 34a, the memory 33a, and the decoder 32a are formed on the conductive section 35a. The DAC 34b, the memory 33b, and the decoder 32b are formed on the conductive section 35b. If the second signal inputted to the IDT 36 includes a positive-phase-sequence component and a negative-phase-sequence component, then surface acoustic waves corresponding to these components will propagate through the different conductive sections. For example, a surface acoustic wave corresponding to the positive-phase-sequence component propagates through the conductive section 35a and a surface acoustic wave corresponding to the negative-phase-sequence component propagates through the conductive section 35b.

The integration circuit made up of the amplifier 37, the condensers C13 and C14, and the switches SW1 and SW2 integrates the sum of the products of the voltage applied to the strain resistance stripes on the conductive sections 35a and 35b and the surface acoustic waves which propagate through the strain resistance stripes over a certain period of time and outputs a result obtained.

The convolver can be used for spreading data to be transmitted, despreading a received signal, code correlation, waveform correlation, or generating a waveform. In the transmitter shown in FIG. 2, for example, the convolver can be used as the code spreader by inputting the data to be transmitted and the spreading code thereto as the first and second signals respectively. In this case, one of the two signals must be converted into an analog signal and be outputted to the IDT 36. In addition, as will be described later, the convolver can be used as, for example, a pulse correlator in the receiver.

In general, a convolver using a surface acoustic wave or a compression wave near a surface functions in the following way. There are two signal input terminals. The sum of the product of each of many delayed signals obtained by passing one signal through a delay line using mechanical vibration and the other signal is outputted. One method for outputting this sum is to generate waves which correspond to the first and second signals and which propagate in opposite directions at both ends of the delay line and to obtain the sum of the products from one electrode by using the nonlinearity of the delay line itself. Another method is to convert each delayed wave into an electrical signal with many IDT electrodes, to obtain product signals with a nonlinear element, such as a diode, and to output the sum of them. With these methods, however, the signals attenuate significantly on the delay line.

Still another method is to provide only one input signal from one end of a delay line and to provide the other input signal as an electrical signal. Delayed signals converted into electrical signals with many IDT electrodes are obtained, the product of each delayed signal and the second signal (electrical signal) is found, and the sum of them is outputted.

In the convolver shown in FIG. 10, a wave corresponding to the first signal occurs in the conductive sections 35a and 35b. The second signal is provided to one end of each of the many strain resistance stripes located perpendicularly to the direction in which the wave propagates, and the sum of signals obtained at the other end of each strain resistance elements is outputted.

The conductive sections 35a and 35b being conductive regions are formed on a semiconductor of silicon, GaAs, or InP by ion implantation (I.I.) or selective epitaxial growth so that they will form stripes or thin lines. If silicon is used, then they should be formed on a conductor substrate of an opposite type or a well. If elements are separated by field oxides (FOXes) by the use of the local oxidation of silicon (LOCOS) technique generally used, then surface wave loss and scattering will occur. If this convolver is formed together with a CMOS circuit, element separation should be performed by, for example, I.I. without using FOXes to narrow a conductor pattern separation. The IDT is fabricated by forming a ferroelectric on the surface of the semiconductor or in a recess portion formed in the semiconductor by etching, and by forming a metal film electrode so that it will face the surface of the ferroelectric.

One of the following structures for preventing reflection can be located outside the area where the conductive regions are arranged like stripes. The IDT is grounded. A structure for reflecting a wave to an area where it will have no influence is formed on the semiconductor (by forming an oblique FOX pattern or forming a drop in surface level on the substrate) A plurality of areas which differ from the conductive regions in the type of a dopant and the propagation speed of an elastic wave are formed.

If a compound semiconductor is used, a semi-insulating substrate is used. In this case, ZnO, LiNbO$_3$, KNbO$_3$, or the like is formed near the conductive regions (semiconductor stripes) formed like stripes or thin lines and the film pattern IDT in the shape of combs opposite to each other is formed on it by using, for example, aluminum. If the delay line and the strain resistance stripes are made of a compound semiconductor having a considerable piezoelectric effect, more particularly of GaAs or GaN, there is no need to form a ferroelectric layer separately. The metal film pattern IDT should be formed directly on the compound semiconductor. The second signal is inputted to one end of each conductive region perpendicular to the direction in which the surface acoustic wave (SAW) travels, and the product of the first signal and the second signal is outputted from the other end of each conductive region.

The surface acoustic wave propagates across the semiconductor stripes. The electric conductivity of the semiconductor stripes changes due to a piezo resistance effect. For example, the convolution of a filter factor inputted from one end of each semiconductor stripe and the surface acoustic wave is outputted from the other end of each semiconductor stripe. The attenuation of the surface acoustic wave can be corrected by the filter factor.

In FIG. 10, the second signal is distributed and is given to the conductive sections 35a and 35b as voltage. To be concrete, a transversal filter factor and the spreading code or the despreading code are written from the data bus 31 and the decoders 32a and 32b to the 8-bit FIFO memories 33a and 33b. The transversal filter factor and the spreading code or the despreading code are converted into analog voltages by the R2R type DACs 34a and 34b located in the conductive sections 35a and 35b respectively and are provided to the conductive sections 35a and 35b.

The first signal is converted into the surface wave by the IDT 36 and propagates to both sides of the IDT 36. If the intervals between the teeth of the metal film pattern of the IDT 36 are equal to half of a wavelength corresponding to the center frequency of the first signal and the number of the teeth is an even number, the phases of the surface wave which propagates to both sides of the IDT 36 are opposite to each other at two points at the same distance from the IDT 36. By locating the conductive regions on both sides of the IDT 36 which converts the first signal into the surface wave, providing the second signal complementarily to both sides of the IDT 36, and finding out the difference between signals outputted from both sides of the IDT 36, convolution output can be obtained. By applying this, the surface wave which propagates to both sides of the IDT 36 can be used effectively. If the starting points of the conductive sections 35a and 35b are shifted to the outside by half of the wavelength and the intervals between the semiconductor stripes are equal to the wavelength, then a Nyquist sampling process can be performed. In this case, a margin for fabrication precision is left.

By providing the transversal filter factor as the first signal and providing a single pulse as the second signal with desired timing, a multiplex waveform can be generated. In addition, a waveform having any power spectrum density can be generated in a frequency domain.

With a conventional SAW delay line, a first signal is converted into a surface wave by an IDT, this surface wave is converted into an electrical signal by another IDT (receiving-end IDT) located at another place, and an operation is performed by using the electrical signal and a second signal. A fourth of the wavelength of the surface wave is suitable for intervals d between the teeth of the receiving-end IDT. The intervals between the semiconductor stripes (strain resistance stripes) shown in FIG. 10 should be wider than or equal to about a fourth of the wavelength of the surface wave. By connecting n convolver fabricated by shifting the starting position of the semiconductor stripes by, for example, d/n (n is an integer) in parallel, a factor can be set more finely (nth order oversampling). With a conventional SAW element using a ferroelectric, the propagation speed of a surface wave is about 3,000 to 6,000 m/s and the upper limits of signal frequency components which can be handled depend on precision in the fabrication of an IDT. If d=0.5 μm, then $$f = v/\lambda$$
$$= v/4d$$
$$= 1.5 \text{ to } 3 \text{ GHz}$$

where v is the propagation speed of the surface wave and λ is the wavelength of the surface wave.

Operation performed in FIG. 2 will now be described.

The code spreader 12 shown in FIG. 2 spreads the data to be transmitted with the spreading code generated by the code generator 11.

The phase selector 13 selects one of the multiple phase clocks generated by the PLL shown in FIGS. 6 through 8 on the basis of the code-spread data to be transmitted and outputs it to the waveform generator 14.

The waveform generator 14 converts the selected multiple phase clock into a single cycle pulse signal by the single cycle generator shown in FIG. 3. The BPF 15 takes only the permissible band from the single cycle pulse outputted from the single cycle generator. The signal to be transmitted outputted from the BPF 15 is sent to the receiver by the antenna 16.

Descriptions will now be given by using a timing chart.

Figure 11:
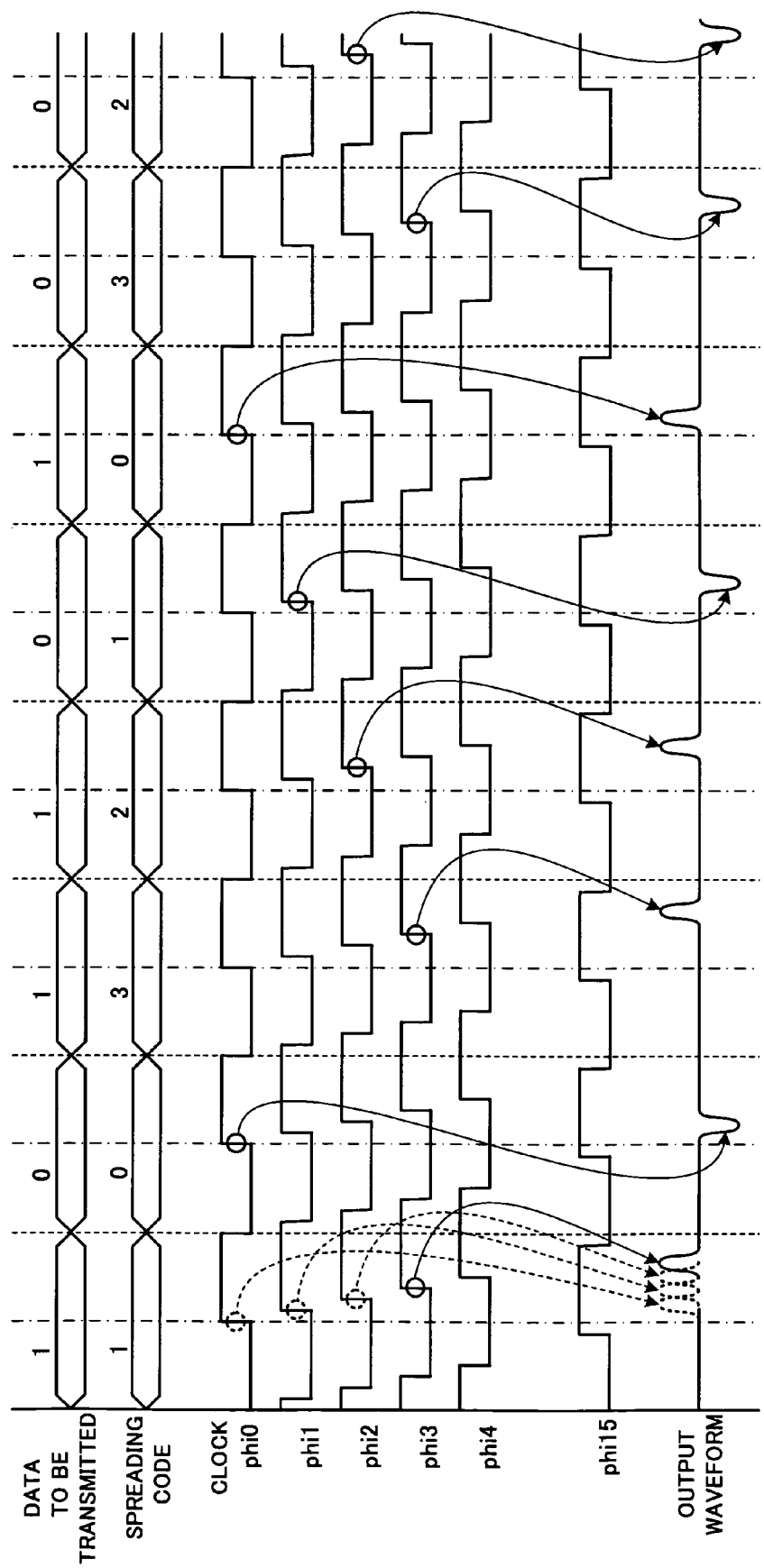
FIG. 11 shows a timing chart for the transmitter.

FIG. 11 shows a timing chart for the transmitter.

Data to be transmitted shown in FIG. 11 is inputted to the code spreader 12 shown in FIG. 2. The numbers "1," "0," "1," "1," and so on indicated on the data to be transmitted are bit values included in the data to be transmitted. A spreading code shown in FIG. 11 is outputted from the code generator 11. The numbers "1," "0," "3," "2," and so on indicated on the spreading code are decimal numbers included in the spreading code. In this example, two bits are used as the spreading code. Clocks phi0, phi1, . . . , and phi 15 are multiple phase clocks inputted to the phase selector 13 shown in FIG. 2. In this example, it is assumed that the phase selector 13 selects one of the clocks phi0 through phi3 on the basis of the spread data to be transmitted and that the phase selector 13 outputs it. The clocks phi0 through phi3 are used for synchronizing an output waveform (signal to be transmitted), so the frequency of the clocks phi0 through phi3 may be lower than the center frequency of the output waveform. For the sake of simplicity it is assumed that the frequency of the clocks phi0 through phi3 is equal to the timing with which a radio signal is outputted, that is to say, to a chip frequency. An output waveform shown in FIG. 11 indicates the waveform of a radio signal outputted from the waveform generator 14 shown in FIG. 2.

The data to be transmitted is spread by the code spreader 12 with the 2-bit spreading code. As shown in FIG. 11, the phase selector 13 selects one of the clocks phi0 through phi3 with different phases on the basis of the code-spread data to be transmitted and outputs it to the waveform generator 14. The waveform generator 14 converts the selected clock into a single cycle pulse signal as shown by the output waveform in FIG. 11 by the single cycle generator shown in FIG. 3 and outputs it. The single cycle pulse signal is outputted in synchronization with one of the clocks phi0 through phi3, so the phase of the single cycle pulse signal outputted depends on a selected clock.

The single cycle pulse signal outputted from the single cycle generator is outputted to the BPF15 and is sent from the antenna 16 to the receiver.

The high-order spreading code except the first two bits is used as a data sequence.

A receiver will now be described.

Figure 12:
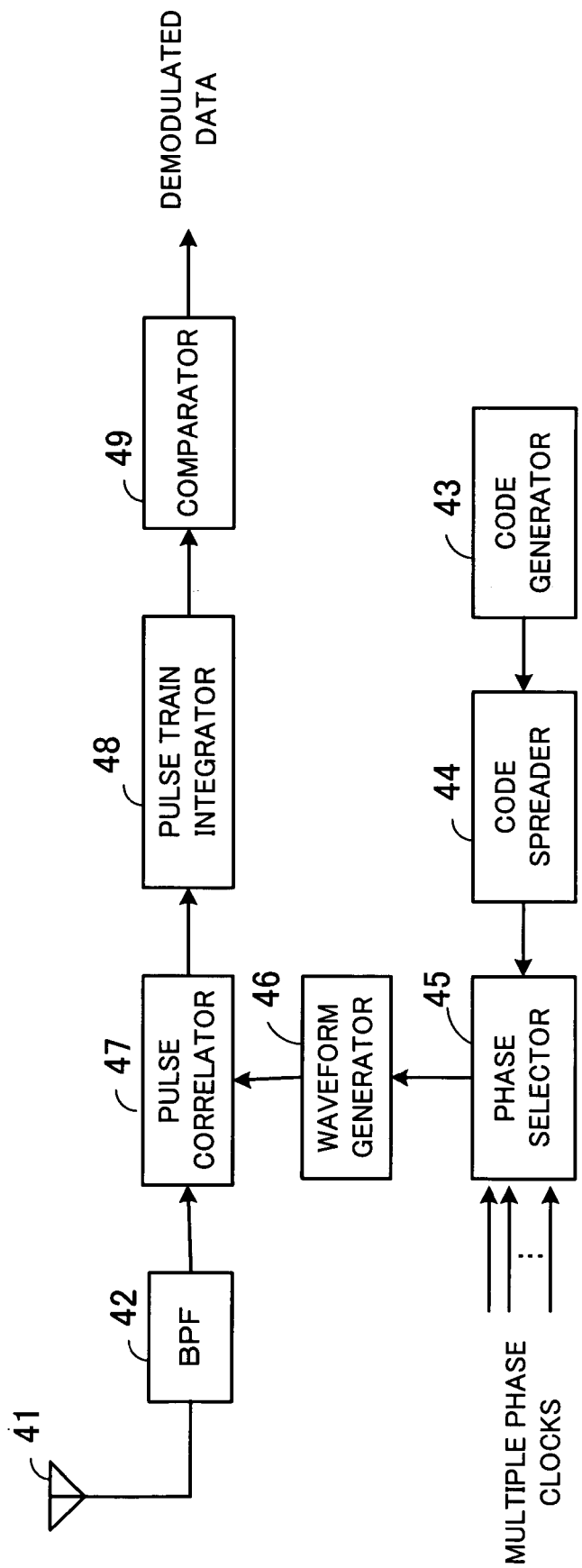
FIG. 12 is a block diagram of a receiver.

FIG. 12 is a block diagram of a receiver.

As shown in FIG. 12, a receiver includes an antenna 41, a BPF 42, a code generator 43, a code spreader 44, a phase selector 45, a waveform generator 46, a pulse correlator 47, a pulse train integrator 48, and a comparator 49. The receiver performs, for example, UWB communication in which a carrier wave is not needed with the transmitter shown in FIG. 2 in the milliwave band.

The antenna 41 receives a radio signal transmitted from the transmitter. The BPF 42 takes only a required band from the radio signal received by the antenna 41.

The code generator 43 generates a despreading code for despreading the received signal (radio signal received by the antenna 41).

The code spreader 44 expand-spreads the despreading code outputted from the code generator 43 and outputs it to the waveform generator 46.

A plurality of clocks with different phases, being multiple phase clocks, are inputted to the phase selector 45. The frequencies and phases of these multiple phase clocks are the same as those of the multiple phase clocks generated in the transmitter. The phase selector 45 selects one of the multiple phase clocks inputted on the basis of the despreading code outputted from the code spreader 44 and outputs it.

The clock selected by the phase selector 45 is inputted to the waveform generator 46. The waveform generator 46 outputs the despreading code as a single cycle pulse signal in synchronization with the clock selected by the phase selector 45.

The pulse correlator 47 outputs a correlation value between the received signal outputted from the BPF 42 and the single cycle pulse outputted from the waveform generator 46. When the waveform (phase) of the received signal and the waveform (phase) of the single cycle pulse match, the greatest correlation value will be obtained.

The pulse train integrator 48 integrates correlation values for the same received signal repeatedly transmitted which are obtained at the same timing in, for example, slots. As a result, a correlation value at the timing will become greater accumulatively in one symbol period.

The comparator 49 outputs the received signal every symbol period when the correlation value integrated by the pulse train integrator 48 reaches a peak.

A circuit which forms each block in FIG. 12 will now be described.

The multiple phase clocks inputted to the phase selector 45 are generated by a PLL which is the same as that shown in FIGS. 6 through 8. The phase selector 45 includes the circuit shown in FIG. 9. In FIG. 9, the despreading code outputted from the code spreader 44 is inputted to the decoder 30a.

The waveform generator 46 includes the single cycle generator shown in FIG. 3. The clock outputted from the phase selector 45 is inputted to the single cycle generator as the input signals i+ and i−. The single cycle generator outputs output signals o+ and o− each having the waveform of a single cycle pulse. This is the same with FIG. 4.

The pulse correlator 47 includes, for example, the convolver shown in FIG. 10. In this case, however, the received signal outputted from the BPF 42 is converted into a digital signal and is outputted to the data bus 31 in the convolver. The single cycle pulse outputted from the waveform generator 46 is inputted to the IDT 36. The correlation value between the received signal and the single cycle pulse is outputted from the integration circuit in the convolver.

Operation performed in FIG. 12 will now be described.

The code spreader 44 shown in FIG. 12 spreads the despreading code generated by the code generator 43.

The phase selector 45 selects one of the multiple phase clocks generated by the PLL on the basis of the despreading code outputted from the code spreader 44 and outputs it to the waveform generator 46.

The waveform generator 46 converts the selected clock into the single cycle pulse signal by the single cycle generator.

The pulse correlator 47 detects a correlation between the single cycle pulse outputted from the waveform generator 46 and the received signal received by the antenna 41 and outputted via the BPF 42.

The pulse train integrator 48 integrates the correlation value. The comparator 49 checks the integrated correlation value outputted from the pulse train integrator 48 every symbol period and outputs it as received data.

The operation of the receiver will now be described with a timing chart.

Figure 13:
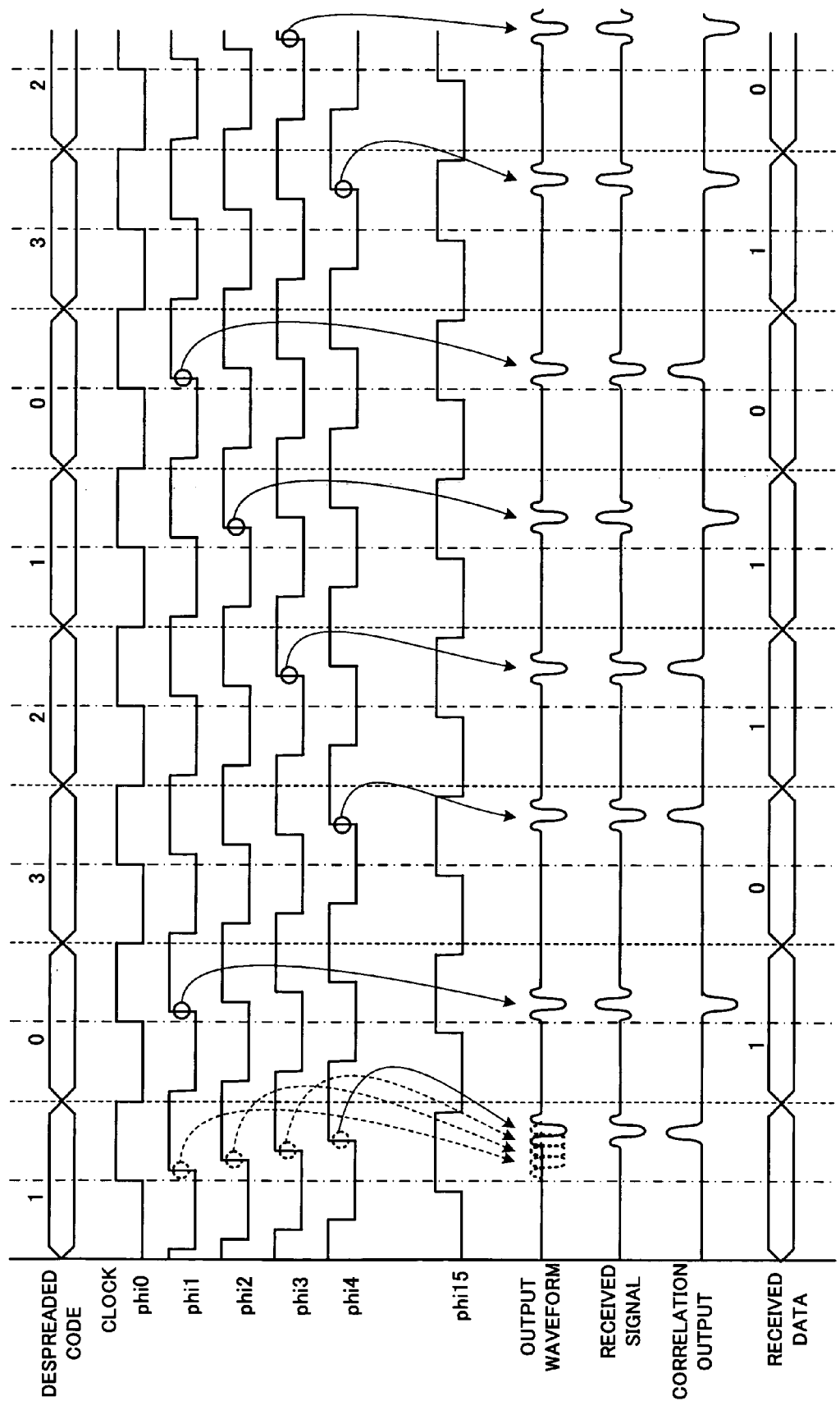
FIG. 13 shows a timing chart for the receiver.

FIG. 13 shows a timing chart for the receiver.

A despreading code shown in FIG. 13 is outputted from the code generator 43 shown in FIG. 12. The numbers "1," "0," "3," "2," and so on indicated on the despreading code are decimal numbers included in the despreading code. In this example, two bits are used as the despreading code. This is the same with the spreading code shown in FIG. 11. Clocks phi0, phi1, . . . , and phi15 are multiple phase clocks inputted to the phase selector 45 shown in FIG. 12. In this example, it is assumed that the phase selector 45 selects and outputs the four clocks phi1 through phi4 in that order. An output waveform shown in FIG. 13 indicates the waveform of a single cycle pulse outputted from the waveform generator 46 shown in FIG. 12. A received signal shown in FIG. 13 is received by the antenna 41. Correlation output shown in FIG. 13 indicates a waveform obtained when the pulse correlator 47 shown in FIG. 12 detects a correlation between the received signal and the output waveform. Received data shown in FIG. 13 indicates received signal data demodulated when a correlation value between the received signal and the output waveform is great.

Conventionally, an increase in data transfer rate has led to an increase in the frequency of a signal for determining timing with which a radio signal is outputted. Accordingly, a high-frequency circuit is needed to generate a signal having such a high frequency. However, it is difficult to design or fabricate such a high-frequency circuit. Moreover, it is difficult to realize such a high-frequency circuit by using CMOS semiconductor devices. As a result, consumption of power is high. As described above, however, an increase in the frequency of the clocks phi0 through phi3 shown in FIG. 11 can be prevented by transmitting and receiving a radio signal of a single cycle pulse in synchronization with multiple phase clocks with different phases. Therefore, the circuits can be realized easily by using CMOS semiconductor devices. In addition, the scale of the circuits can be reduced, resulting in lower power consumption.

A communication system according to a second embodiment of the present invention will now be described in detail with reference to the drawings. As shown in FIG. 4, in the first embodiment a selected multiple phase clock is converted into a single cycle pulse and is transmitted as a radio signal. In the second embodiment, a selected multiple phase clock is converted into a burst wave and is transmitted as a radio signal. Only the differences in circuit which forms each block between the first embodiment shown in FIGS. 2 and 12 and the second embodiment will now be described.

Figure 14:
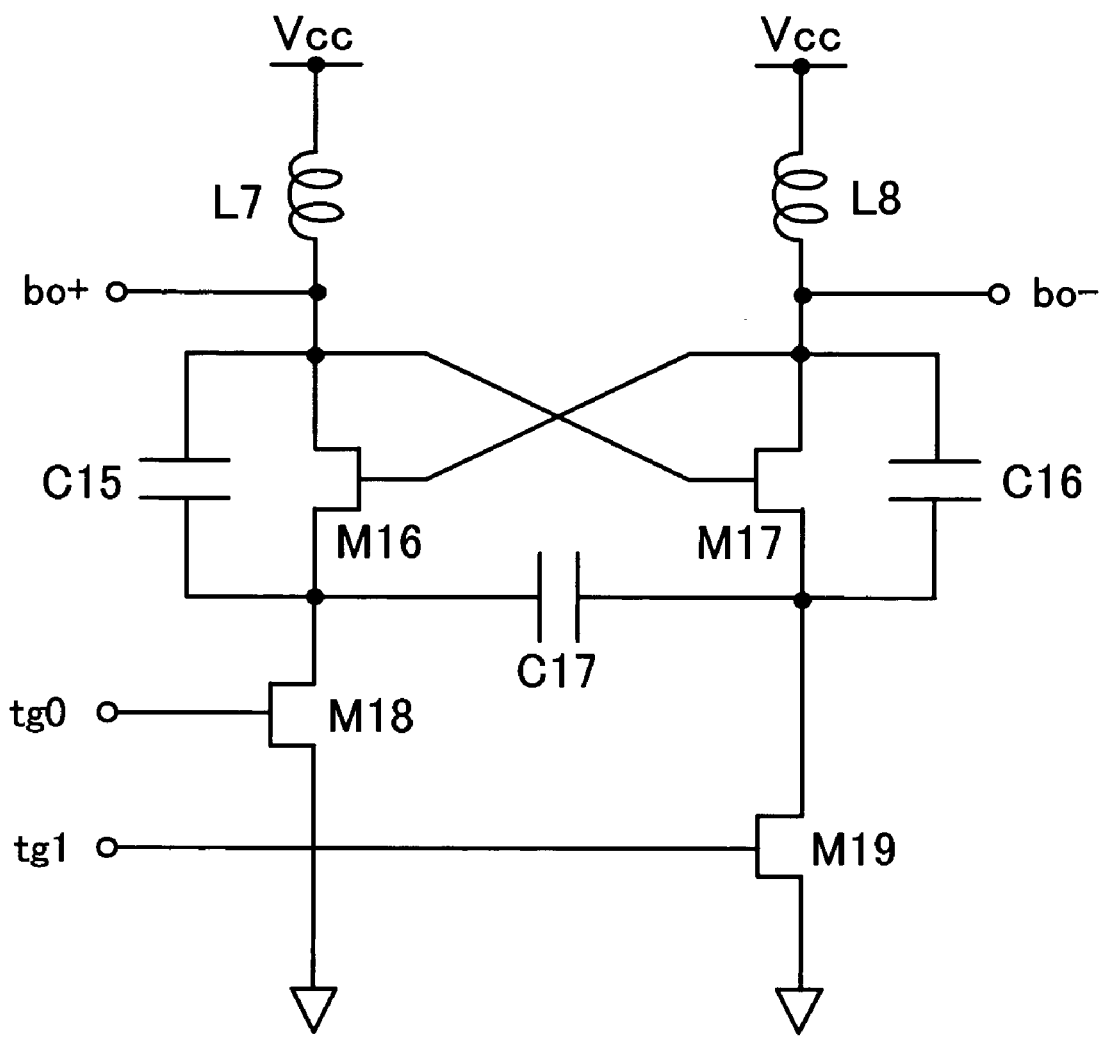
FIG. 14 is a circuit diagram of a balanced interrupted oscillator for outputting a burst wave.

FIG. 14 is a circuit diagram of a balanced interrupted oscillator for outputting a burst wave.

The single cycle generator included in the waveform generator 14 shown in FIG. 2 or the waveform generator 46 shown in FIG. 12 is a balanced interrupted oscillator for outputting a burst wave. The balanced interrupted oscillator converts a selected multiple phase clock into a burst wave. As shown in FIG. 14, the balanced interrupted oscillator includes transistors M16 through M19, condensers C15 through C17, and inductors L7 and L8.

A drain of the transistor M16 is connected to one end of the inductor L7 the other end of which is connected to a power supply Vcc. A source of the transistor M16 is connected to a drain of the transistor M18. A gate of the transistor M16 is connected to a drain of the transistor M17.

The drain of the transistor M17 is connected to one end of the inductor L8 the other end of which is connected to the power supply Vcc. A source of the transistor M17 is connected to a drain of the transistor M19. A gate of the transistor M17 is connected to the drain of the transistor M16.

The condenser C15 is connected between the drain and source of the transistor M16. The condenser C16 is connected between the drain and source of the transistor M17. The condenser C17 is connected to the sources of the transistors M16 and M17.

The sources of the transistors M18 and M19 are connected to a ground. Multiple phase clocks tg0 and tg1 are inputted to gates of the transistors M18 and M19 respectively. Burst waves bo+ and bo− are taken from the drains of the transistors M16 and M17 respectively.

The balanced interrupted oscillator shown in FIG. 14 generates a wave train with a center frequency of fc and any length. This balanced interrupted oscillator can be used in cases where a short wave train is used in the sub-millimeter wave or millimeter wave band, or for multiband communication. If a higher frequency is needed, then a stub with a length equal to a fourth of the wavelength corresponding to the center frequency is used. Moreover, the balanced interrupted oscillator is balanced by connecting the inductors (or stubs) in the resonance sections in the two Colpitts oscillators. When the multiple phase clock tg0 and tg1 rises, the balanced interrupted oscillator begins to oscillate. When the multiple phase clock tg0 and tg1 falls, the balanced interrupted oscillator stops oscillating. The polarity of the burst waves bo+ and bo− depends on the order in which the multiple phase clocks tg0 and tg1 rise. An interval Δtg between the time when the multiple phase clock tg0 rises and the time when the multiple phase clock tg1 rises is given by $$(2k+1)/2fc$$

where k is an integer greater than or equal to zero.

Figure 15:
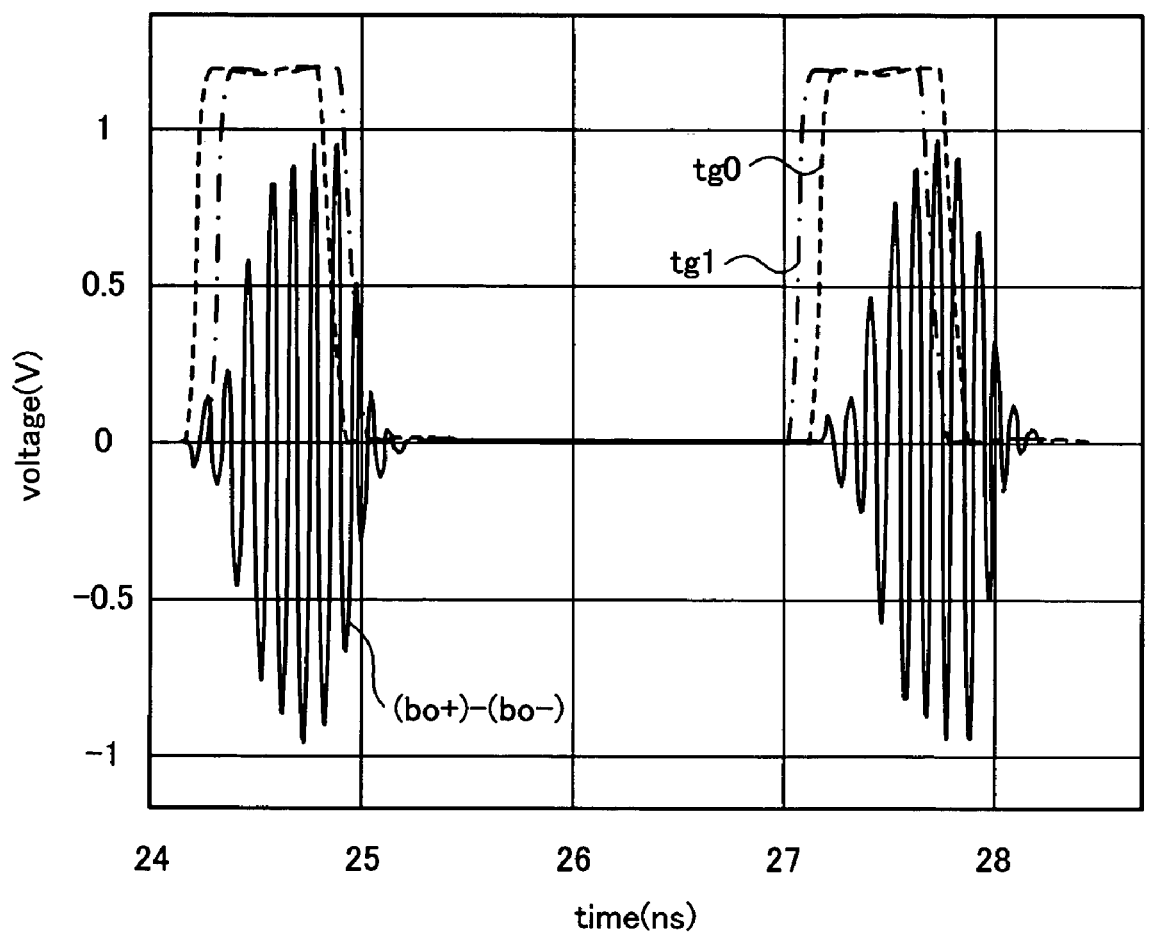
FIG. 15 shows the waveforms of input to and output from the balanced interrupted oscillator.

FIG. 15 shows the waveforms of input to and output from the balanced interrupted oscillator.

The horizontal axis of a graph shown in FIG. 15 indicates time in ns. The vertical axis of the graph indicates voltage in volts. A dotted line shown in FIG. 15 indicates the multiple phase clock tg0 inputted to the gate of the transistor M18 shown in FIG. 14. A chain line shown in FIG. 15 indicates the multiple phase clock tg1 inputted to the gate of the transistor M19 shown in FIG. 14. A solid line shown in FIG. 15 indicates a waveform corresponding to the differential ((bo+)−(bo−)) between the burst waves bo+ and bo−.

As shown in FIG. 15, the burst waves are outputted in synchronization with the multiple phase clocks tg0 and tg1. The polarity of the burst waves depends on the positional relation between the phases of the multiple phase clocks tg0 and tg1 inputted to the gates of the transistors M18 and M19 respectively. For example, if the phase of the multiple phase clock tg0 precedes the phase of the multiple phase clock tg1 in FIG. 15, then the burst wave falls at first. If the phase of the multiple phase clock tg1 precedes the phase of the multiple phase clock tg0, then the burst wave rises at first.

Figure 16:
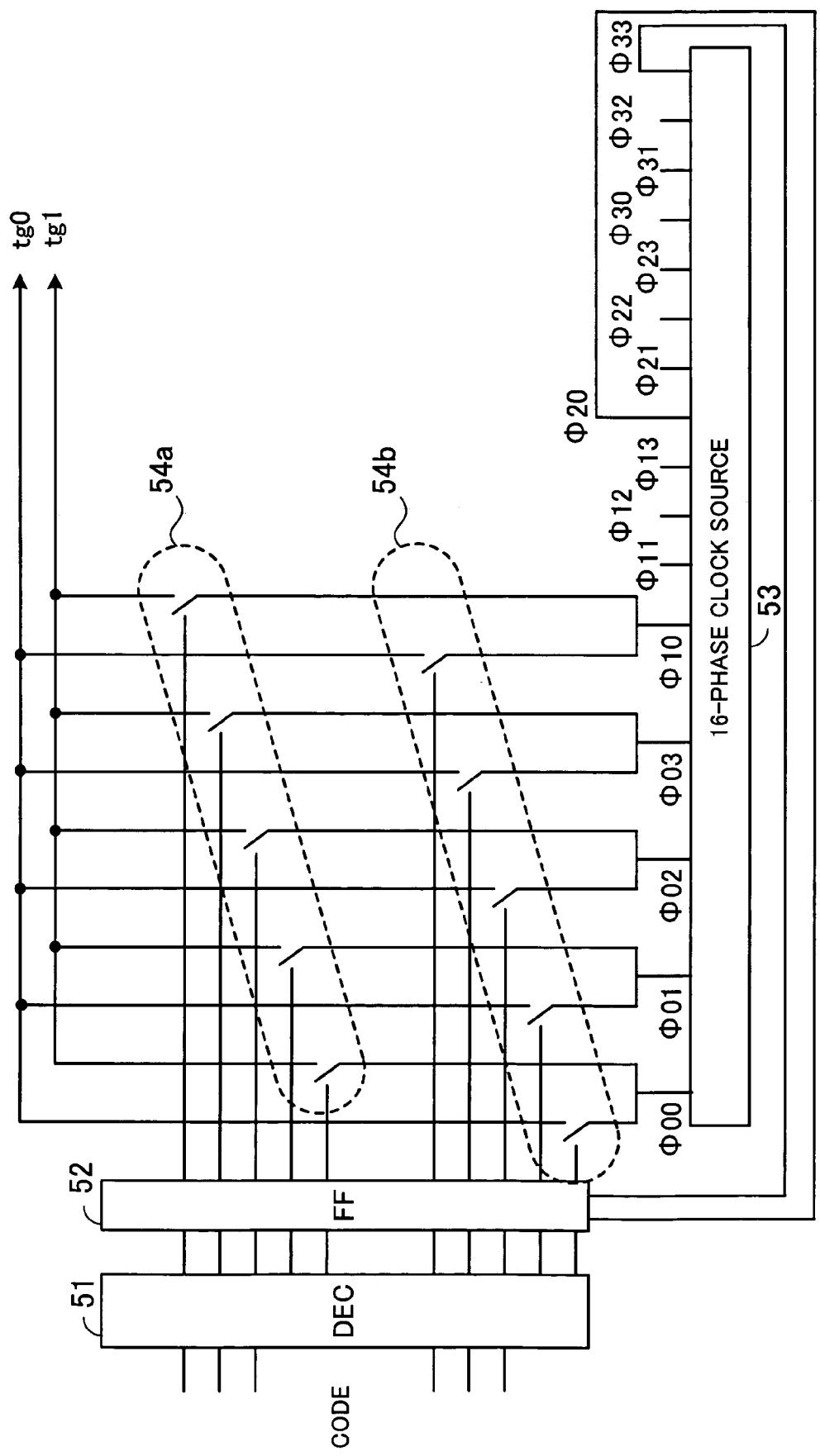
FIG. 16 is a circuit diagram of a PPM circuit.

FIG. 16 is a circuit diagram of a PPM circuit.

The phase selector 13 shown in FIG. 2 or the phase selector 45 shown in FIG. 12 is a pulse position modulation (PPM) circuit. As shown in FIG. 16, a PPM circuit includes a decoder (DEC) 51, a flip-flop circuit (FF) 52, a 16-phase clock source 53, and selectors 54a and 54b. The 16-phase clock source 53 can be realized by the PLL shown in FIGS. 6 through 8.

Code-spread data to be transmitted or a despreading code is inputted to the decoder 51. The decoder 51 decodes the code inputted thereto and outputs the decoded code to the flip-flop circuit 52.

The 16-phase clock source 53 outputs clocks Φ00 through Φ03, Φ10 through Φ13, Φ20 through Φ23, and Φ30 through Φ33 with different phases. The five phase clocks Φ00 through Φ03 and Φ10 of the sixteen phase clocks are outputted to the selectors 54a and 54b. The clocks Φ20 and Φ23 with different phases of the sixteen phase clocks are outputted to the flip-flop circuit 52. The 16-phase clock source 53 outputs a clock at a frequency equal to, for example, a fourth of the center frequency fc of a radio signal. To be concrete, the 16-phase clock source 53 outputs a clock at a frequency of 6.375 GHz.

The flip-flop circuit 52 inputs the code outputted from the decoder 51 in response to the clock Φ20 inputted and settles the input of the code outputted from the decoder 51 in response to the clock Φ33 inputted. The flip-flop circuit 52 can input or output the code reliably with timing given by the multiple phase clocks with different phases.

Each of the selectors 54a and 54b includes a plurality of switches. The selectors 54a and 54b turn on/off the switches in accordance with the decoded code outputted from the flip-flop circuit 52 and outputs a clock outputted from the 16-phase clock source 53 as the multiple phase clocks tg0 and tg1.

There are four kinds of phase patterns. In addition, the phase of the multiple phase clock tg0 may precede the phase of the multiple phase clock tg1, and vice versa. That is to say, the PPM circuit shown in FIG. 16 can output eight kinds of multiple phase clocks tg0 and tg1. For example, the switch in the selector 54b corresponding to the clock Φ00 is turned on and the switch in the selector 54a corresponding to the clock Φ01 is turned on. Then the switch in the selector 54b corresponding to the clock Φ01 is turned on and the switch in the selector 54a corresponding to the clock Φ02 is turned on. As a result, multiple phase clocks tg0 and tg1 with different phases will be outputted. On the other hand, by turning on the switch in the selector 54a corresponding to the clock Φ00 and turning on the switch in the selector 54b corresponding to the clock Φ01, the positional relation between the phases of multiple phase clocks tg0 and tg1 outputted is reversed.

Multiple phase clocks outputted from the PPM circuit are inputted to the balanced interrupted oscillator shown in FIG. 14 and are converted into a burst wave. In a transmitter, the burst wave is outputted to a BPF and is transmitted from an antenna as a radio signal. This is the same with the first embodiment. In a receiver, the burst wave is outputted to a pulse correlator where a correlation between the burst wave and the signal received by an antenna is detected.

As described above, the communication system according to the second embodiment of the present invention is also applicable to multiband communication by transmitting and receiving a radio signal of a burst wave in synchronization with multiple phase clocks with different phases. Moreover, a high-frequency circuit is unnecessary. Therefore, the circuits can be realized by using CMOS semiconductor devices and consumption of power can be reduced.

An example of application of the communication system according to the first or second embodiment of the present invention will now be described.

Figure 17:
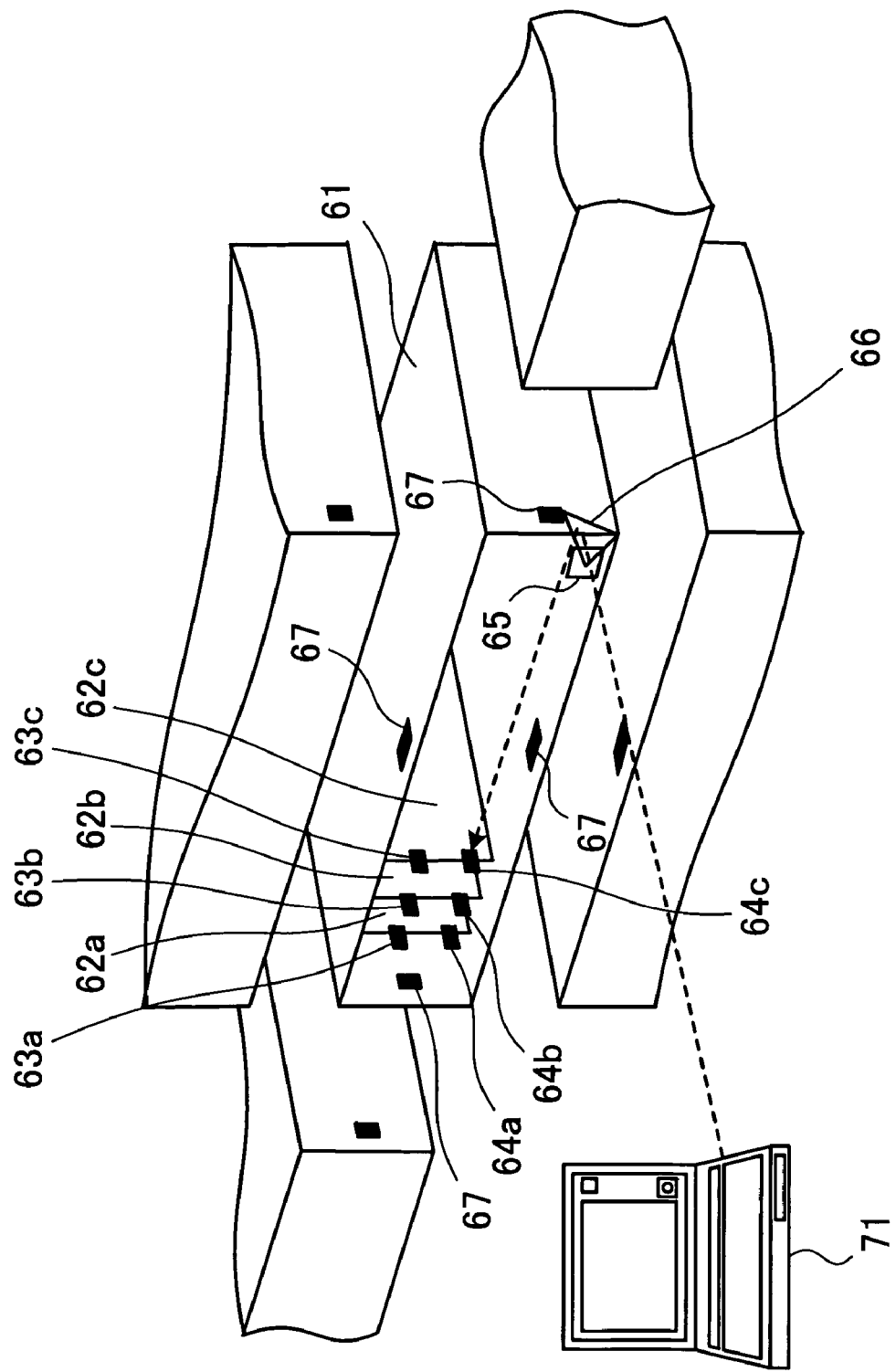
FIG. 17 shows an example of communication in an enclosure.

FIG. 17 shows an example of communication in an enclosure.

A plurality of CPU boards 62a, 62b, 62c, etc. on each of which a CPU is mounted are housed in an enclosure 61 shown in FIG. 17. Transmitting modules 63a, 63b, 63c, etc. and receiving modules 64a, 64b, 64c, etc. for performing radio communication are mounted on the CPU boards 62a, 62b, 62c, etc. respectively. A filter window 65 which a radio wave passes through is placed in the enclosure 61. A mirror 66 for reflecting a radio wave is located in the enclosure 61. In addition, windows 67 for inputting radio waves from other enclosures or outputting radio waves to the other enclosures are placed in the top, bottom, left side, and right side of the enclosure 61. In FIG. 17, a notebook computer 71 is shown. The structure of the other enclosures shown in FIG. 17 is the same as that of the enclosure 61.

Each enclosure houses many CPU boards (blade computers) A transmitting module and a receiving module for performing radio communication are mounted at one end of each CPU board housed in each enclosure. High-speed digital circuits including a CPU will produce RF noise. Many of them are made up of CMOS LSIs. This RF noise includes noise at frequencies higher than or equal to the maximum operating frequencies (ft) of high power transistors, but the amount of energy radiated by this noise is small. The upper limit of communication capacity is given by Shannon's theorem, that is to say, by $$R = B \log_2(1-SNR)$$

where B is a bandwidth used and SNR is an S/N ratio at communication time. By performing communication at higher frequencies where noise is low, greater SNR will be obtained without changing power. This enables high-speed large-capacity communication.

The operating speed of CPUs and advanced CMOSes used in their peripheral circuits has increased and ft has already reached 200 GHz. However, usually transistors the maximum operating frequencies of which are lower than about 50 GHz are used in high power off-chip drivers in order to ensure high breakdown voltages and electrostatic breakdown strength. Accordingly, a transmitter-receiver RF module in which In-P high electron mobility transistors (In-PHEMTs) are formed is used and these transistors are made to operate at frequencies in the 60 GHz band. By doing so, communication can be performed at rates of several tens to several hundreds of gigabits per second. With the progress of CMOS technologies, there is a possibility that the 80 GHz band or a band higher than or equal to 100 GHz must be used in the future. By using In-PHEMTs, however, these bands can be used even at present. In the first and second embodiments of the present invention, communication is performed in synchronization with the timing of multiple phase clocks. Therefore, on the one hand, low-speed elements, such as CMOS semiconductor devices, are used for forming a circuit for generating these multiple phase clocks in order to raise an integration level. On the other hand, the use of In-PHEMTs the manufacturing costs of which are high is minimized. By doing so, a high-frequency band can be used.

Another example of application of the communication system according to the first or second embodiment of the present invention will now be described.

Figure 18:
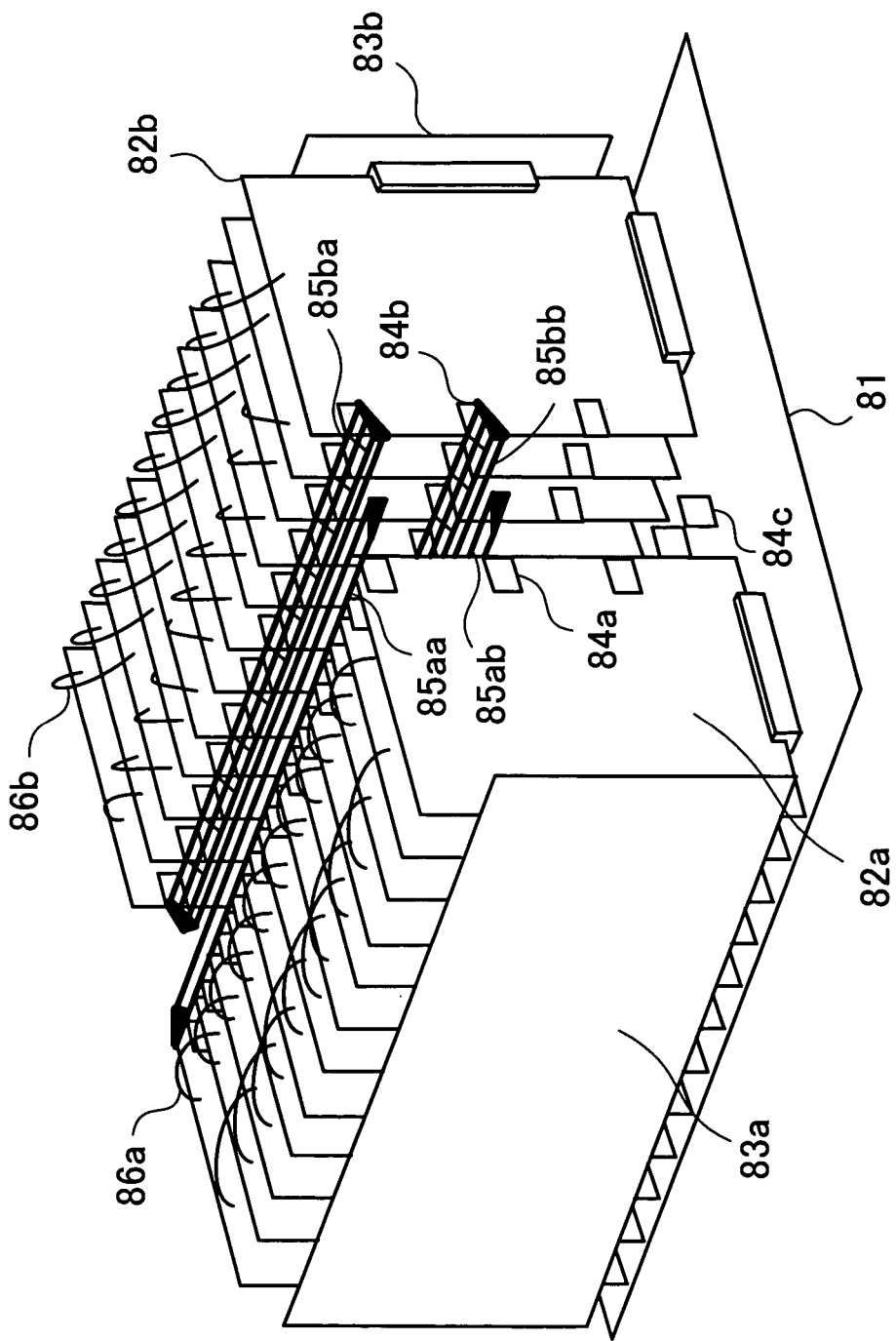
FIG. 18 shows another example of communication in an enclosure.

FIG. 18 shows another example of communication in an enclosure.

As shown in FIG. 18, a plurality of CPU boards 82a on each of which a CPU is mounted and a plurality of CPU boards 82b on each of which a CPU is mounted are mounted in two rows on a back plane 81. High-speed parallel bus boards 83a and 83b are fixed to the sides of the CPU boards 82a and 82b respectively. Three transmitter-receiver modules 84a for performing radio communication are mounted on each CPU board 82a. Similarly, three transmitter-receiver modules 84b for performing radio communication are mounted on each CPU board 82b. The upper transmitter-receiver modules 84a mounted on the CPU boards 82a are connected to one another by a dielectric waveguide 85aa. The middle transmitter-receiver modules 84a mounted on the CPU boards 82a are connected to one another by a dielectric waveguide 85ab. The upper transmitter-receiver modules 84b mounted on the CPU boards 82b are connected to one another by a dielectric waveguide 85ba. The middle transmitter-receiver modules 84b mounted on the CPU boards 82b are connected to one another by a dielectric waveguide 85bb. Transmitter-receiver modules 84c for performing radio communication are mounted on the back plane 81. The CPU boards 82a and 82b are connected by serial communication cables 86a and 86b respectively.

The plurality of CPU boards 82a and the plurality of CPU boards 82b are mounted on the back plane 81 below them. An external sensor, an actuator, a power supply, and the like are connected to the back plane 81. The CPU boards 82a are connected to one another by the high-speed parallel bus board 83a and the CPU boards 82b are connected to one another by the high-speed parallel bus board 83b. In addition, each of the CPU boards 82a are connected to near CPU boards 82a by serial communication cables 86a, being high-speed Ethernet (registered trademark) or the like, and each of the CPU boards 82b are connected to near CPU boards 82b by serial communication cables 86b. These are conventional data communication means in which the sending end uniquely determines a destination to perform communication (a multicast and broadcast can also be performed by specifying addresses arranged).

Each of the transmitter-receiver modules 84a and 84b includes an antenna. Millimeter wave radio communication is performed with the transmitter-receiver modules 84a and 84b among the CPU boards 82a and 82b and the back plane 81. As a result, a more flexible communication network is obtained. In FIG. 18, three transmitter-receiver modules 84a are mounted on each of the CPU boards 82a and three transmitter-receiver modules 84b are mounted on each of the CPU boards 82b. The upper transmitter-receiver modules 84a mounted on the CPU boards 82a are connected to one another by the dielectric waveguide 85aa. The middle transmitter-receiver modules 84a mounted on the CPU boards 82a are connected to one another by the dielectric waveguide 85ab. The upper transmitter-receiver modules 84b mounted on the CPU boards 82b are connected to one another by the dielectric waveguide 85ba. The middle transmitter-receiver modules 84b mounted on the CPU boards 82b are connected to one another by the dielectric waveguide 85bb. In this example, an antenna included in each of the upper and middle transmitter-receiver modules 84a and 84b is smaller than an antenna included in each of the lower transmitter-receiver modules 84a and 84b and is inserted into the waveguide so that it will reach the center of the waveguide. Reflection prevention structures are fitted on both ends of each waveguide and a microwave absorber is fitted on each reflection prevention structure. The side of each waveguide is covered with a microwave absorber to prevent signals from the lower transmitter-receiver modules 84a and 84b from entering it.

As described above, the communication system according to the first or second embodiment of the present invention is applicable to remote controllers for electronics, short-haul digital communication systems for wireless LANs, and the like.

By making the transmitter and the receiver described in the first or second embodiment of the present invention operate on the basis of the same clock, overhead necessary for chip synchronization in each communication session can be saved.

Figure 19:
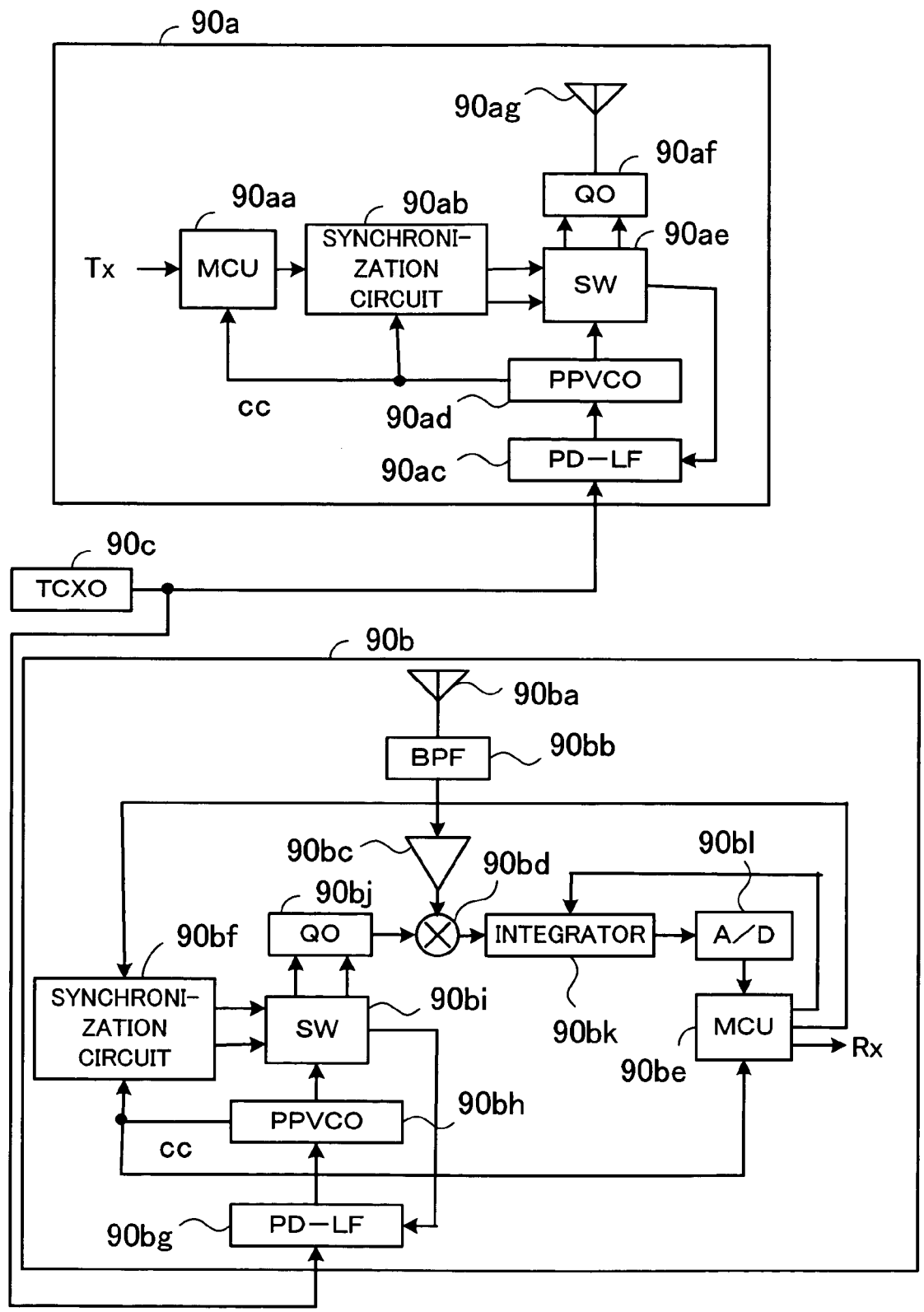
FIG. 19 is a circuit block diagram of a communication apparatus.

FIG. 19 is a circuit block diagram of a communication apparatus.

As shown in FIG. 19, a communication apparatus comprises a transmitter 90a, a receiver 90b, and a TCXO 90c. The transmitter 90a includes a microcontroller unit (MCU) 90aa, a synchronization circuit 90ab, a phase detector-loop filter (PD-LF) 90ac, a polyphase VCO (PPVCO) 90ad, an SW 90ae, a QO 90af, and an antenna 90ag. The receiver 90b includes an antenna 90ba, a BPF 90bb, a low noise amplifier (LNA) 90bc, a mixer 90bd, an MCU 90be, a synchronization circuit 90bf, a PD-LF 90bg, a PPVCO 90bh, an SW 90bi, a QO 90bj, an integrator 90bk, and an A/D 90bl.

The MCU 90aa in the transmitter 90a contains a memory in which a spreading code is stored. In synchronization with a chip rate clock cc outputted from the PPVCO 90ad, the MCU 90aa code-spreads data Tx to be transmitted inputted thereto and outputs the code-spread data to the synchronization circuit 90ab by bits corresponding to each symbol.

In synchronization with one of multiple phase clocks outputted from the PPVCO 90ad which gives the maximum timing margin, the synchronization circuit 90ab accepts the code-spread data Tx to be transmitted outputted from the MCU 90aa and outputs it to the SW 90ae.

The PD-LF 90ac outputs the difference in phase between a reference clock (at a frequency of several to 50 megahertz) outputted from the TCXO 90c, being a crystal oscillator, and a clock outputted from the SW 90ae as a voltage value. The PPVCO 90ad outputs the multiple phase clocks obtained by multiplying the frequency of the reference clock outputted from the TCXO 90c. In this case, the PPVCO 90ad exercises control according to the voltage value outputted from the PD-LF 90ac so that the frequencies of the multiple phase clocks outputted will be constant. The frequency of the multiple phase clocks is the chip rate clock cc.

On the basis of the code-spread data Tx to be transmitted outputted from the synchronization circuit 90ab, the SW 90ae selects one of the multiple phase clocks outputted from the PPVCO 90ad and performs a PPM and a BPSK modulation.

The QO 90af converts the selected multiple phase clock outputted from the SW 90ae into a single cycle pulse like that shown in FIG. 4 or a burst wave like that shown in FIG. 15.

The antenna 90ag transmits the single cycle pulse or the burst wave outputted from the QO 90af to a receiving-end communication apparatus as a radio signal.

The antenna 90ba in the receiver 90b receives the radio signal from the transmitting-end communication apparatus. The antenna 90ba outputs the radio signal (received signal) it received to the BPF 90bb.

The BPF 90bb takes only a permissible band from the received signal and outputs it to the LNA 90bc. The LNA 90bc amplifies the received signal outputted from the BPF 90bb and outputs it to the mixer 90bd.

The MCU 90be contains a memory in which a despreading code for despreading the received signal is stored. The MCU 90be outputs the despreading code to the synchronization circuit 90bf in synchronization with a chip rate clock cc outputted from the PPVCO 90bh.

In synchronization with one of multiple phase clocks outputted from the PPVCO 90bh which gives the maximum timing margin, the synchronization circuit 90bf accepts the despreading code outputted from the MCU 90be and outputs it to the SW 90bi.

The PD-LF 90bg outputs the difference in phase between a reference clock outputted from the TCXO 90c, being a crystal oscillator, and a clock outputted from the SW 90bi as a voltage value. This is the same with the PD-LF 90ac in the transmitter 90a. The PPVCO 90bh outputs the multiple phase clocks obtained by multiplying the frequency of the reference clock outputted from the TCXO 90c. In this case, the PPVCO 90bh exercises control according to the voltage value outputted from the PD-LF 90bg so that the frequencies of the multiple phase clocks outputted will be constant. The frequency of the multiple phase clocks is generated on the basis of the reference clock outputted from the TCXO 90c, so the frequency of the chip rate clock cc in the receiver 90b is the same as that of the chip rate clock cc in the transmitter 90a.

On the basis of the despreading code outputted from the synchronization circuit 90bf, the SW 90bi selects one of the multiple phase clocks outputted from the PPVCO 90bh and performs a PPM and a BPSK modulation.

The QO 90bj converts the selected multiple phase clock outputted from the SW 90bi into a single cycle pulse or a burst wave.

The mixer 90bd detects a correlation between the received signal outputted from the LNA 90bc and the single cycle pulse or the burst wave outputted from the QO 90bj and outputs it to the integrator 90bk. Strictly speaking, carrier synchronization at the center frequency of the burst wave is required between the transmitting end and the receiving end. To avoid this, the following method, for example, can be used. Burst waves which orthogonally cut each other are generated by a delay unit or the like on the receiver 90b side and are handled by the mixer 90bd used as a correlator.

The integrator 90bk obtains received data by performing integration over a symbol period and outputs it to the A/D 90bl. The A/D 90bl performs digital conversion on the received data and outputs the digital-converted received data to the MCU90be. The MCU90be outputs the digital-converted received data as received data Rx. The MCU90be gives the integrator 90bk instructions to perform integration over the symbol period.

The operation of the communication apparatus shown in FIG. 19 will now be described.

The PPVCO 90ad in the transmitter 90a multiplies the frequency of the reference clock outputted from the TCXO 90c shared by the PPVCO 90bh in the receiver 90b and oscillates at the frequency of the chip rate clock cc.

The data Tx to be transmitted is temporarily stored in a register in the MCU 90aa in synchronization with the chip rate clock cc. The MCU 90aa spreads the data Tx to be transmitted with the spreading code stored in advance in the memory contained in the MCU 90aa and outputs the code-spread data to the synchronization circuit 90ab by bits corresponding to each symbol. In synchronization with one of the multiple phase clocks outputted from the PPVCO 90ad which gives the maximum timing margin, the synchronization circuit 90ab accepts the code-spread data Tx to be transmitted outputted from the MCU 90aa.

On the basis of the code-spread data Tx to be transmitted synchronized and outputted from the synchronization circuit 90ab, the SW 90ae selects one of the multiple phase clocks outputted from the PPVCO 90ad. The QO 90af converts the selected multiple phase clock into a single cycle pulse or a burst wave and outputs it to the antenna 90ag. As a result, a PP-modulated, BPSK-modulated radio signal is outputted from the antenna 90ag.

The BPF 90bb in the receiver 90b takes a permissible band from the received signal received by the antenna 90ba. The LNA 90bc amplifies the received signal and then the mixer 90bd performs detection on the received signal.

The MCU 90be outputs the despreading code to the synchronization circuit 90bf by bits corresponding to each symbol. In synchronization with one of the multiple phase clocks outputted from the PPVCO 90bh which gives the maximum timing margin, the synchronization circuit 90bf accepts the despreading code outputted from the MCU 90be.

The SW 90bi selects one of the multiple phase clocks outputted from the PPVCO 90bh on the basis of the despreading code outputted from the synchronization circuit 90bf. The QO 90bj converts the selected multiple phase clock into a single cycle pulse or a burst wave and outputs it to the mixer 90bd.

The integrator 90bk integrates a signal outputted from the mixer 90bd over a symbol period and outputs an obtained signal to the A/D 90bl. The A/D 90bl performs digital conversion on the signal outputted from the integrator 90bk. The MCU90be outputs the digital-converted signal as the received data Rx.

As described above, by synchronizing the transmitter 90a and the receiver 90b by one TCXO 90c, overhead necessary for chip synchronization in each communication session can be saved. A delay for output from the TCXO 90c on a wiring and a propagation delay on an air channel between the transmitter 90a and the receiver 90b are calibrated at idle time or at the time of starting the system.

The above method is also applicable to the transmitting modules 63a, 63b, 63c, and so on and the receiving modules 64a, 64b, 64c, and so on shown in FIG. 17. By making all of these modules operate on the basis of the same clock, overhead necessary for chip synchronization in each communication session can be saved. In addition, the above method is applicable to the transmitter-receiver modules 84a and 84b shown in FIG. 18. By making all of these modules operate on the basis of the same clock, overhead necessary for chip synchronization in each communication session can be saved.

A communication system according to a third embodiment of the present invention will now be described in detail with reference to the drawings. This communication system is applicable to probing apparatus, obstacle detection radars, and the like.

To reduce the amount of energy radiated and perform probing or communication in a wide area, a narrow beam (radio signal) should be used for scanning. Accordingly, mechanical scanning (rotating an antenna, for example) is performed, but this is inferior to a fixed antenna in durability, earthquake resistance, size, and power consumption.

The following phase distributor is used for performing electronic scanning. This phase distributor includes n common-gate type Colpitts oscillators the gate electrodes of which are connected to one another via resistors, and outputs n sine waves obtained by dividing the difference in phase between sine waves inputted to both ends into (n+1) parts.

Figure 20:
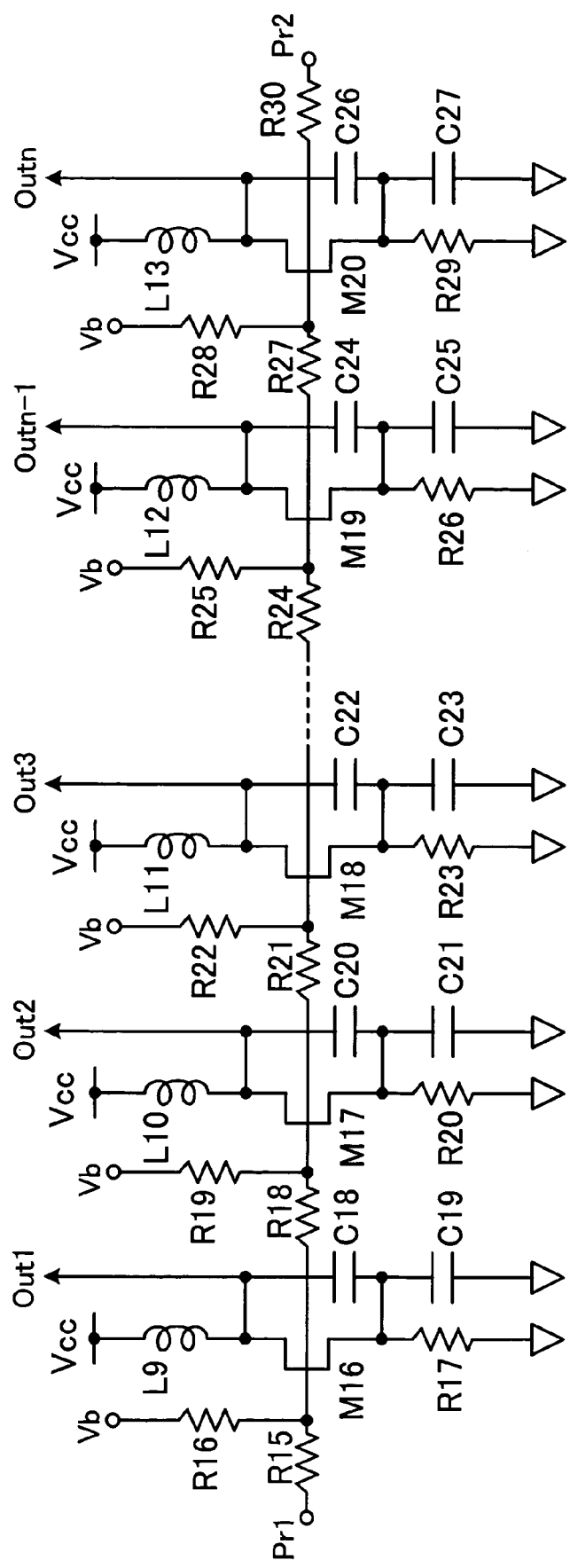
FIG. 20 is a circuit diagram of a phase distributor.

FIG. 20 is a circuit diagram of a phase distributor.

As shown in FIG. 20, a phase distributor includes transistors M16 through M20, resistors R15 through R30, condensers C18 through C27, and inductors L9 through L13.

A drain of the transistor M16 is connected to one end of the inductor L9 the other end of which is connected to a power supply Vcc. A source of the transistor M16 is connected to one end of the resistor R17 the other end of which is connected to a ground. The condenser C18 is connected between the drain and source of the transistor M16. The source of the transistor M16 is connected to one end of the condenser C19 the other end of which is connected to the ground. A gate of the transistor M16 is connected to the resistors R15 and R16. A sine-wave signal is inputted to the resistor 16. Bias voltage Vb is inputted to the resistor R16.

The transistor M16, the resistors R16 and R17, the condensers C18 and C19, and the inductor L9 make up a Colpitts oscillator. Similarly, the transistor M17, the resistors R19 and R20, the condensers C20 and C21, and the inductor L10 make up a Colpitts oscillator. Furthermore, the transistor M18, the resistors R22 and R23, the condensers C22 and C23, and the inductor L11 make up a Colpitts oscillator. The transistors in these Colpitts oscillators are connected to one another via the resistors R18 and R21. In addition, Colpitts oscillators each having the same structure are connected. That is to say, a Colpitts oscillator made up of the transistor M19, the resistors R25 and R26, the condensers C24 and C25, and the inductor L12 and a Colpitts oscillator made up of the transistor M20, the resistors R28 and R29, the condensers C26 and C27, and the inductor L13 are connected to the above Colpitts oscillators via the resistors R24 and R27. The resistors R15 and R30 are connected to the gates of the transistors M16 and M20 respectively.

When the sine wave $Pr1=Ae^{i(\Phi i+\omega ct)}$ is inputted to the resistor R15 connected to the gate of the transistor M16 at one end and the sine wave $Pr2=Ae^{i(\Phi i+\theta+\omega ct)}$ is inputted to the resistor R30 connected to the gate of the transistor M20 at the other end, phase-divided signals Out1, Out2, Out3, ..., Out(n−1), and Outn generated by dividing the difference in phase between these sine waves are outputted from the sources of the transistors in the Colpitts oscillators. The phase-divided signal Outk outputted from the source of the kth transistor is given by $$Outk=Be^{i(\Phi o+k\theta/(n+1)+\omega ct)}$$

where A and B are amplitude, $\Phi i$, $\Phi o$, and $\theta$ are phase angles, $\omega c$ is angular velocity, t is time, k is a constant, and n is a positive number.

With the phase distributor shown in FIG. 20, the difference between the oscillation frequency of each Colpitts oscillator and the frequencies of the sine waves inputted is within a range of about 2 to 5%. By comparing the phases of signals outputted from adjacent Colpitts oscillators and providing negative feedback of the difference to each Colpitts oscillator, input with a wider frequency range can be handled regardless of product variations and a change in operating conditions (this can be realized easily by applying the above method to the voltage controlled oscillator 27 included in the PLL shown in FIG. 6). A method for combining oscillation circuits for the same purpose is also presented in Brian K. Meadows et al., *Nonlinear Antenna Technology*, Proceedings of The IEEE, Vol. 90, No. 5, May 2002.

An antenna for scanning beams will now be described.

Figure 21:
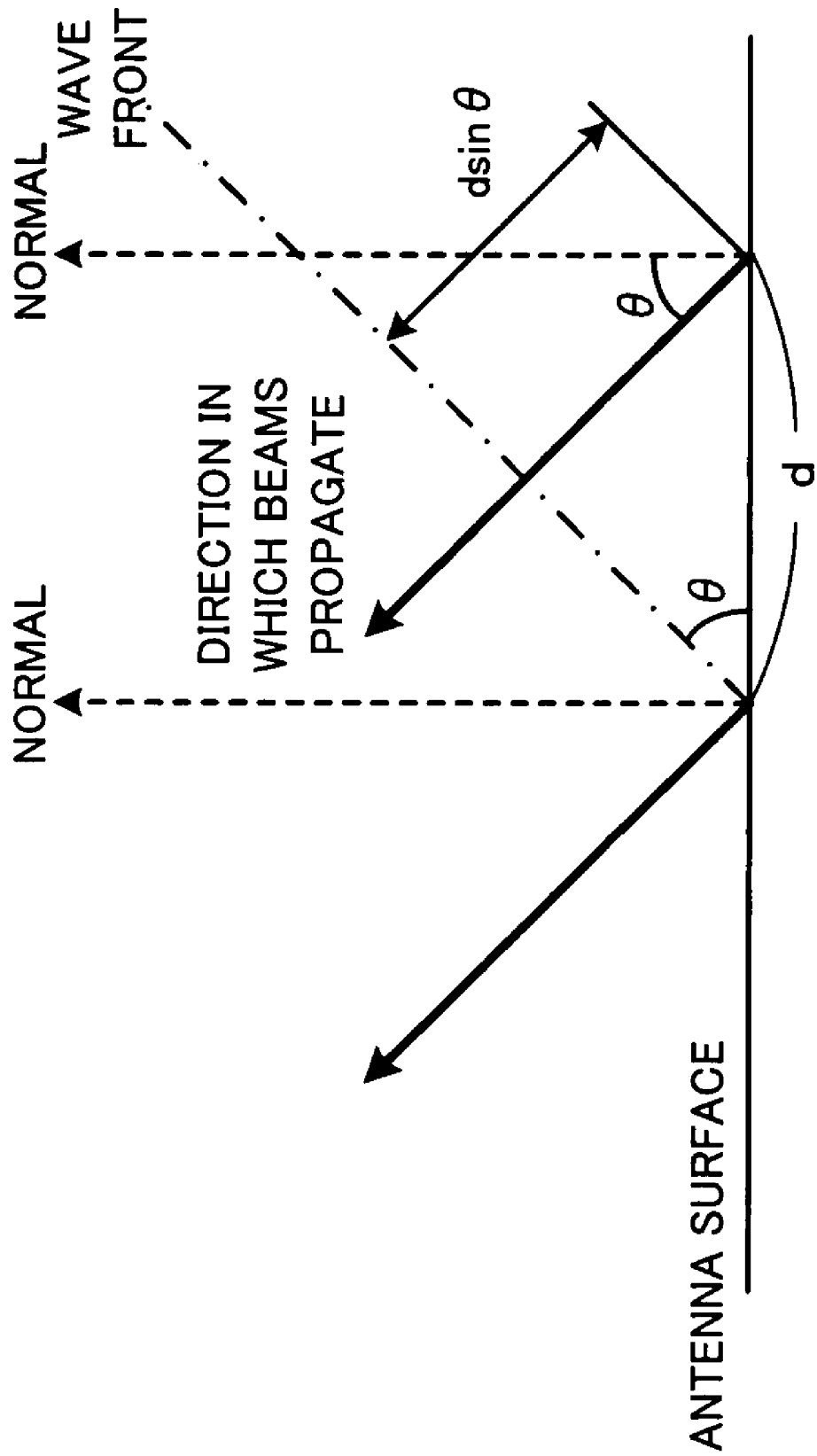
FIG. 21 is a sectional view of an antenna for scanning beams by controlling delay time.

FIG. 21 is a sectional view of an antenna for scanning beams by controlling delay time.

A section of an antenna is shown in FIG. 21. In FIG. 21, two beams radiated from an antenna surface at an interval of a distance d are shown.

It is assumed that a radio signal is transmitted from a plurality of antennas and that transmission time is staggered by $$-\Delta T=d\sin(\theta)/c$$

where $\theta$ is the angle between the normal to the antenna surface and the beams, and c is the velocity of light. The wave front of the beams is indicated by a chain line in FIG. 21. As a result, the beams can be scanned. By generating receiving template signals which differ from one another in timing in a receiver, scanning can be performed in the direction of receiving. Since a wide band can be used, the distance d can be set comparatively freely. In addition, even if the number of antenna elements is small, the diameter of an aperture can be made large.

A transmitter and receiver for scanning beams will now be described.

Figure 22:
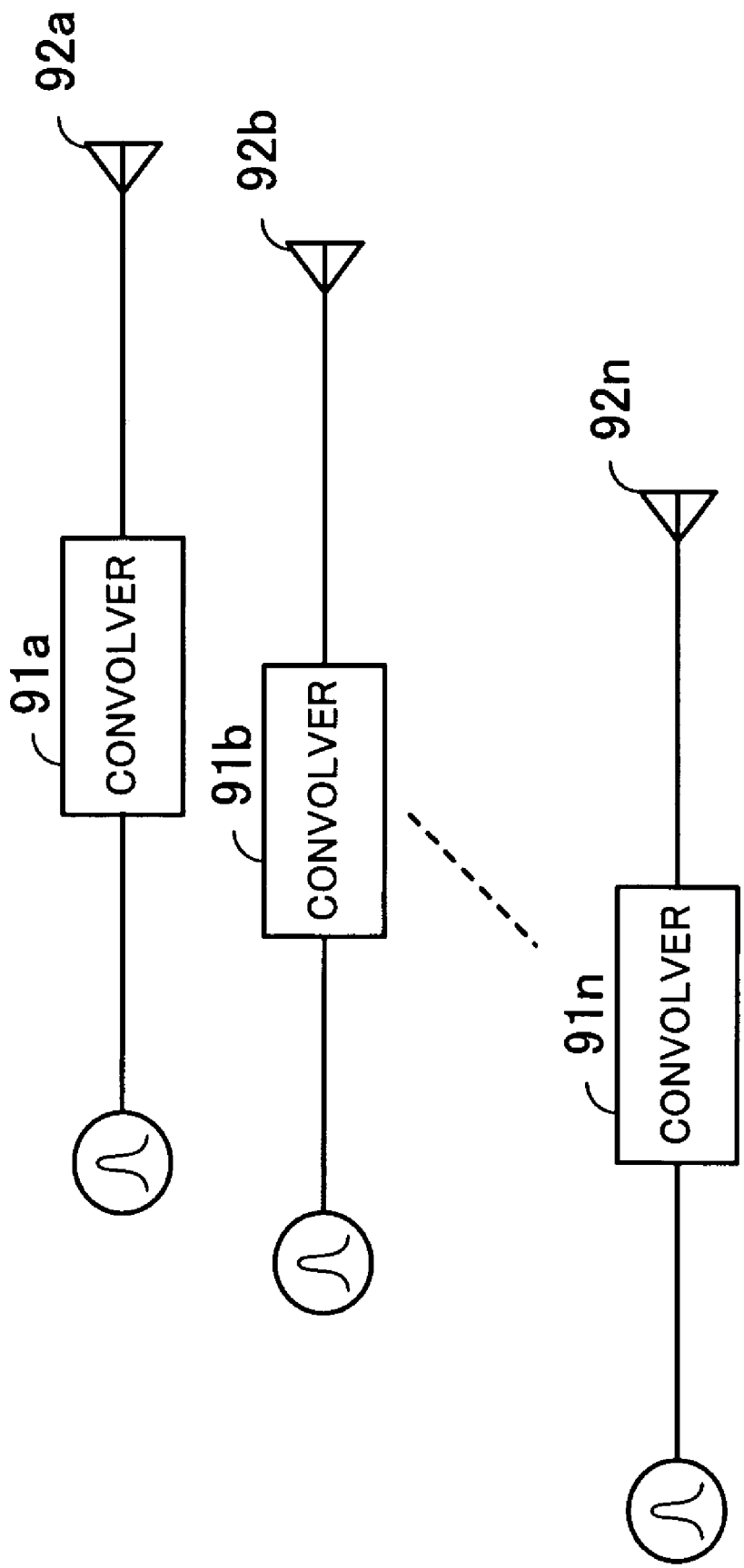
FIG. 22 shows the rough structure of a transmitter for deflecting a directional beam.

FIG. 22 shows the rough structure of a transmitter for deflecting a directional beam.

Arbitrary waveforms are given by convolvers 91a, 91b, ..., and 91n on the basis of a single cycle pulse generated with timing corresponding to a deflection direction and are transmitted via antennas 92a, 92b, ..., and 92n. If the convolvers 91a, 91b, ..., and 91n are not included, then this transmitter is a single cycle pulse transmitter. If BPFs are used in place of the convolvers, then this transmitter is a wave train transmitter. Moreover, if the balanced interrupted oscillator shown in FIG. 14 is driven by the phase distributor shown in FIG. 20 to perform transmission, the balanced interrupted oscillator functions as a wave train transmitter.

Figure 23:
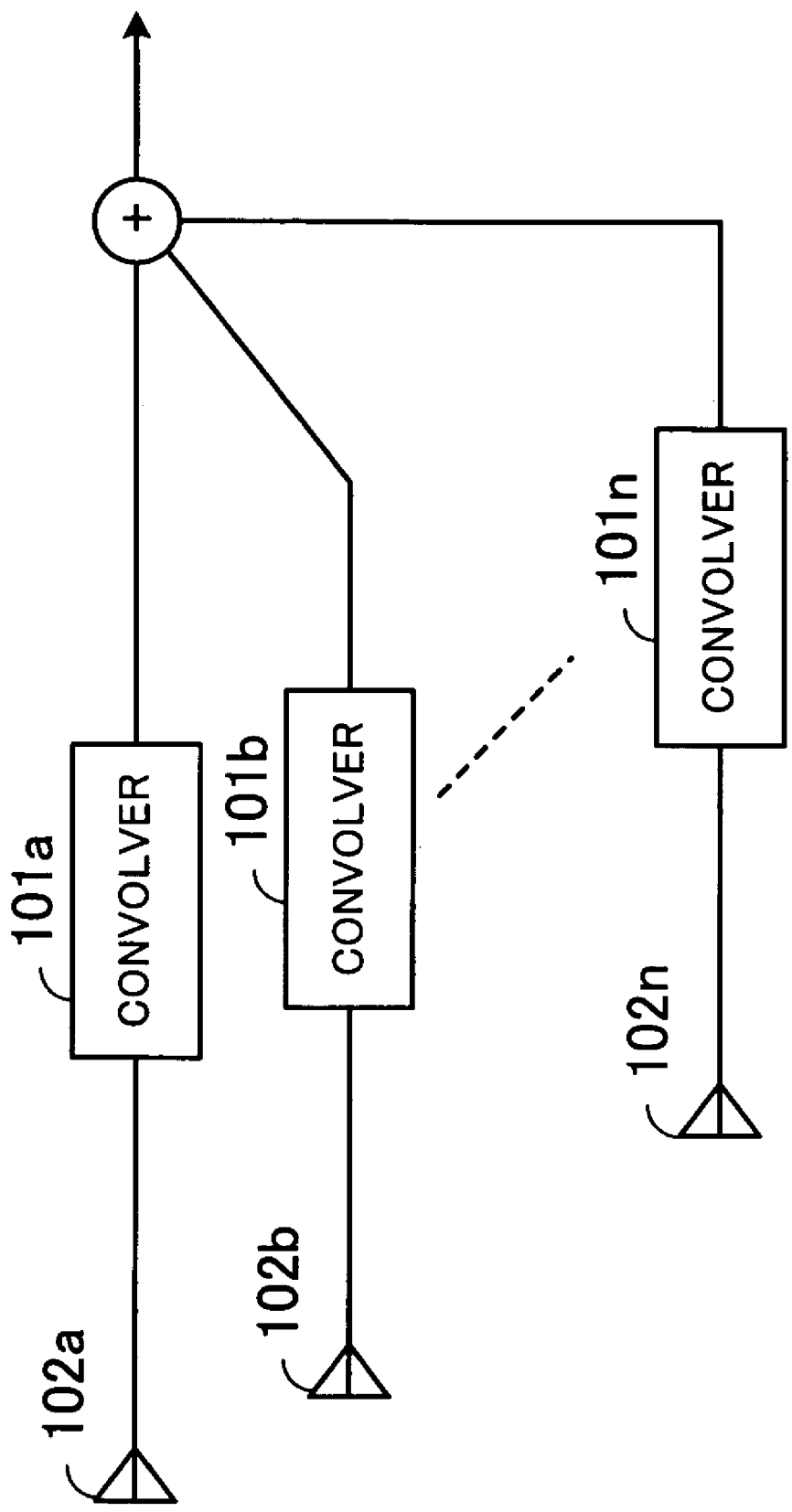
FIG. 23 shows the rough structure of a receiver for deflecting a receiving direction.

FIG. 23 shows the rough structure of a receiver for deflecting a receiving direction.

Each of convolvers 101a, 101b, ..., and 101n shown in FIG. 23 contains a square circuit in place of an integrator. Each of the convolvers 101a, 101b, ..., and 101n is paired with an orthogonal convolver the conductive layer pattern of which is shifted by T/4. Different values corresponding to deflection angles are provided to the respective conductive sections of the convolvers on the routes from antennas 102a, 102b, ..., and 102n. This structure can also be used on the transmitting side.

Receiving template signals which differ from one another in timing are generated in order and a correlation between a received signal and a receiving template signal is detected. By detecting the timing of the generation of a receiving template signal which gives a great correlation value, the timing of a received signal received by each of the antennas 102a, 102b, ..., and 102n is known. The direction from which the received signal reached is known from the timing of the received signal ($\theta$, being the direction from which the received signal reached, can be calculated by using the above equation).

By outputting single cycle pulses with different phases by using the phase distributor shown in FIG. 20, the transmitter can scan beams more finely. By generating receiving template signals with different phases by using the phase distributor shown in FIG. 20, the receiver can scan received signals more finely.

A wide band receiver will now be described.

Figure 24:
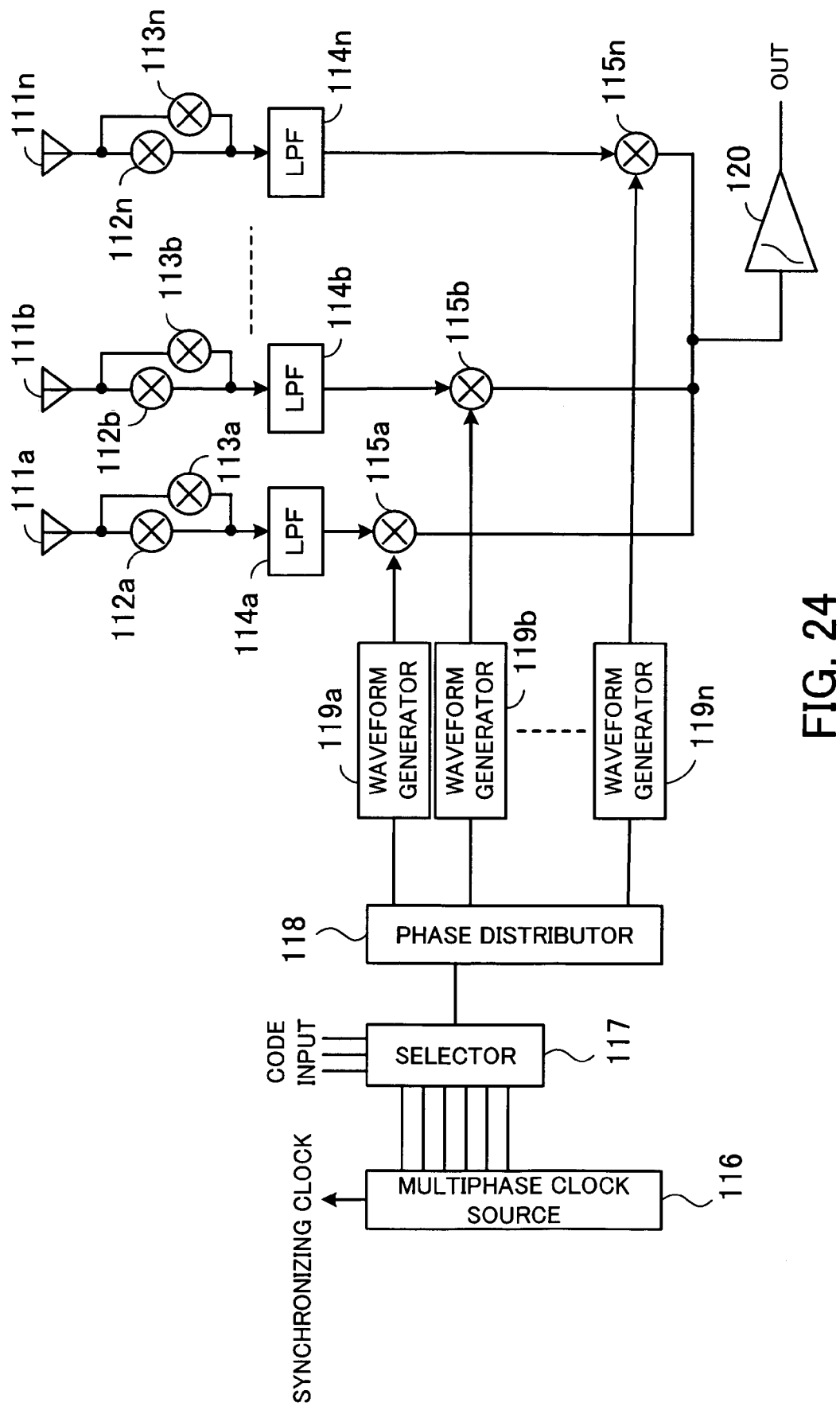
FIG. 24 is a block diagram of a wide band receiver using a reference wave.

FIG. 24 is a block diagram of a wide band receiver using a reference wave.

As shown in FIG. 24, a wideband receiver includes antennas 111a, 111b, ..., and 111n, mixers 112a, 112b, ..., and 112n and 113a, 113b, ..., and 113n, low-pass filters (LPFs) 114a, 114b, ..., and 114n, mixers 115a, 115b, ..., and 115n, a multiphase clock source 116, a selector 117, a phase distributor 118, waveform generators 119a, 119b, ..., and 119n, and an integrator 120.

The antennas 111a, 111b, ..., and 111n receive radio signals outputted for, for example, detecting an obstacle. The mixers 112a, 112b, ..., and 112n and 113a, 113b, ..., and 113n down-convert or direct-convert the radio signals received by the antennas 111a, 111b, ..., and 111n respectively. The LPFs 114a, 114b, ..., and 114n cut off high frequency bands of signals outputted from the mixers 112a and 113a, 112b and 113b, ..., and 112n and 113n respectively.

The multiphase clock source 116 outputs clocks the phases of which differ by the same amount. A despreading code is inputted to the selector 117. The selector 117 selects and outputs one of the clocks outputted from the multiphase clock source 116 in accordance with the despreading code.

The phase distributor 118 is the same as that shown in FIG. 20 and divides the phase of the clock outputted from the selector 117. As a result, clocks with various phases can be outputted and beams (received radio signal) can be detected more finely.

The waveform generators 119a, 119b, . . . , and 119n generate reference waves with which the correlation of the beams should be detected on the basis of the clocks outputted from the phase distributor 118.

The mixers 115a, 115b, . . . , and 115n mix the signals outputted from the waveform generator 119a and the LPF 114a, the waveform generator 119b and the LPF 114b, . . . , and the waveform generator 119n and the LPF 114n respectively. The integrator 120 integrates signals outputted from the mixers 115a, 115b, . . . , and 115n.

If directivity is not required, then one waveform generator, one antenna, and one mixer should be used. A phase distributor is unnecessary. Furthermore, down conversion or direct conversion can be performed by using an orthogonal local oscillator. In this case, carrier synchronization is unnecessary. In addition, a receiving direction can be changed. In this case, a plurality of waveform generators are used and a phase distributor is used at need. By locating phase distributors at many stages, a receiving direction can be adjusted more finely.

As described above, a radio signal is deflected, is transmitted, and is received from a specific direction. As a result, the transmitting and receiving of a signal can be performed between, for example, the back plane 81 and a lower transmitter-receiver module 84a or 84b on a particular CPU board 82a or 82b shown in FIG. 18. An antenna is contained in each of the transmitter-receiver modules 84a mounted on the CPU boards 82a and the transmitter-receiver modules 84b mounted on the CPU boards 82b. Moreover, a small receiving antenna and a receiving circuit are contained in some of LSIs mounted on the CPU boards 82a and 82b.

A communication system according to a fourth embodiment of the present invention will now be described in detail with reference to the drawing.

Figure 25:
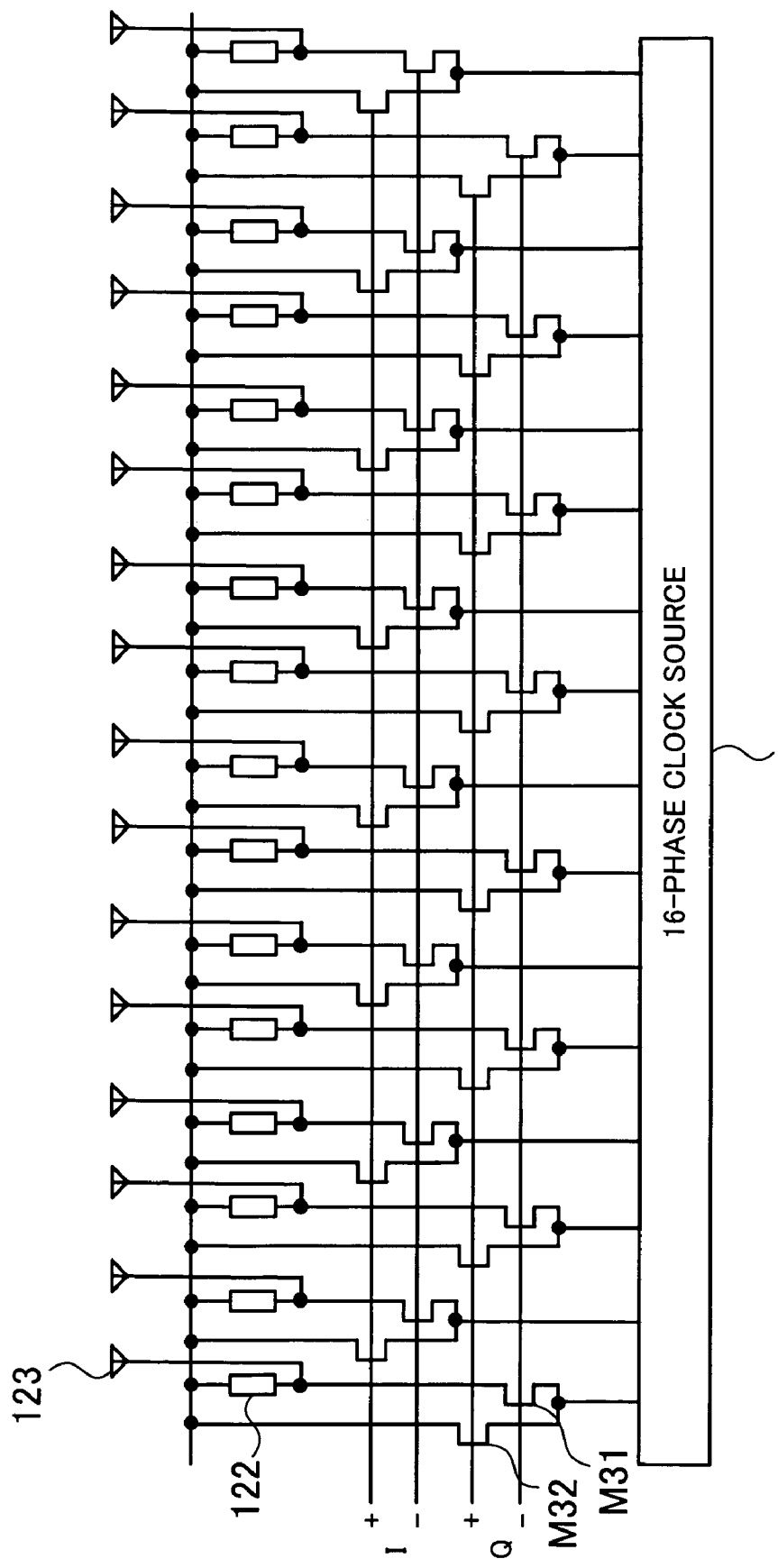
FIG. 25 is a circuit diagram of a quadrature modulation sending circuit.

FIG. 25 is a circuit diagram of a quadrature modulation sending circuit.

A 16-phase clock source 121 shown in FIG. 25 is a clock source for outputting sixteen clocks (negative pulses) with different phases at a frequency of 15.625 GHz. As shown in FIG. 25, sources of transistors M31 and M32 are connected to one output terminal of the 16-phase clock source 121. An antenna 123 is connected to a drain of the transistor M31 and a power supply is connected to a drain of the transistor M32. A stub 122 with a length equal to a fourth of the wavelength corresponding to a frequency of 62.5 GHz is connected between the antenna 123 and the power supply. Transistors which are the same as the transistors M31 and M32, a stub which is the same as the stub 122, and an antenna which is the same as the antenna 123 are connected to each output terminal of the 16-phase clock source 121.

Code-spread serial data is inputted to gates of these transistors. This data is mutually orthogonal differential baseband signals and inputted as signals I and Q. When the transistors turn on by the signal I or Q, the stubs are driven by negative current pulses outputted from the 16-phase clock source 121. The antennas output signals at frequency of 62.5 GHz are generated in respective stubs. The transistors are turned on/off by the signal I or Q with the timing of four clocks outputted from the 16-phase clock source 121 at 4-phase spacing.

The phases of the signals I and Q are selected in increments of 90 degrees, so four different states can be obtained. By selecting four clocks outputted from the 16-phase clock source 121 at 4-phase spacing, the quadrature-modulated signals I and Q at a frequency of 62.5 GHz, which is four times the frequency (=15.625 GHz) of a clock outputted from the 16-phase clock source 121, can be generated. As stated above, the code-spread data is quadrature-modulated and is output from the antennas as the signals at a frequency four times the frequency of the sixteen clocks with different phases.

In the above example, a signal generated in each stub is outputted from each antenna. However, a signal obtained by summing the outputs from the sixteen transistors at one stub may be outputted from one antenna.

A quadrature modulation receiving circuit for receiving a signal outputted from the quadrature modulation sending circuit shown in FIG. 25 will now be described.

Figure 26:
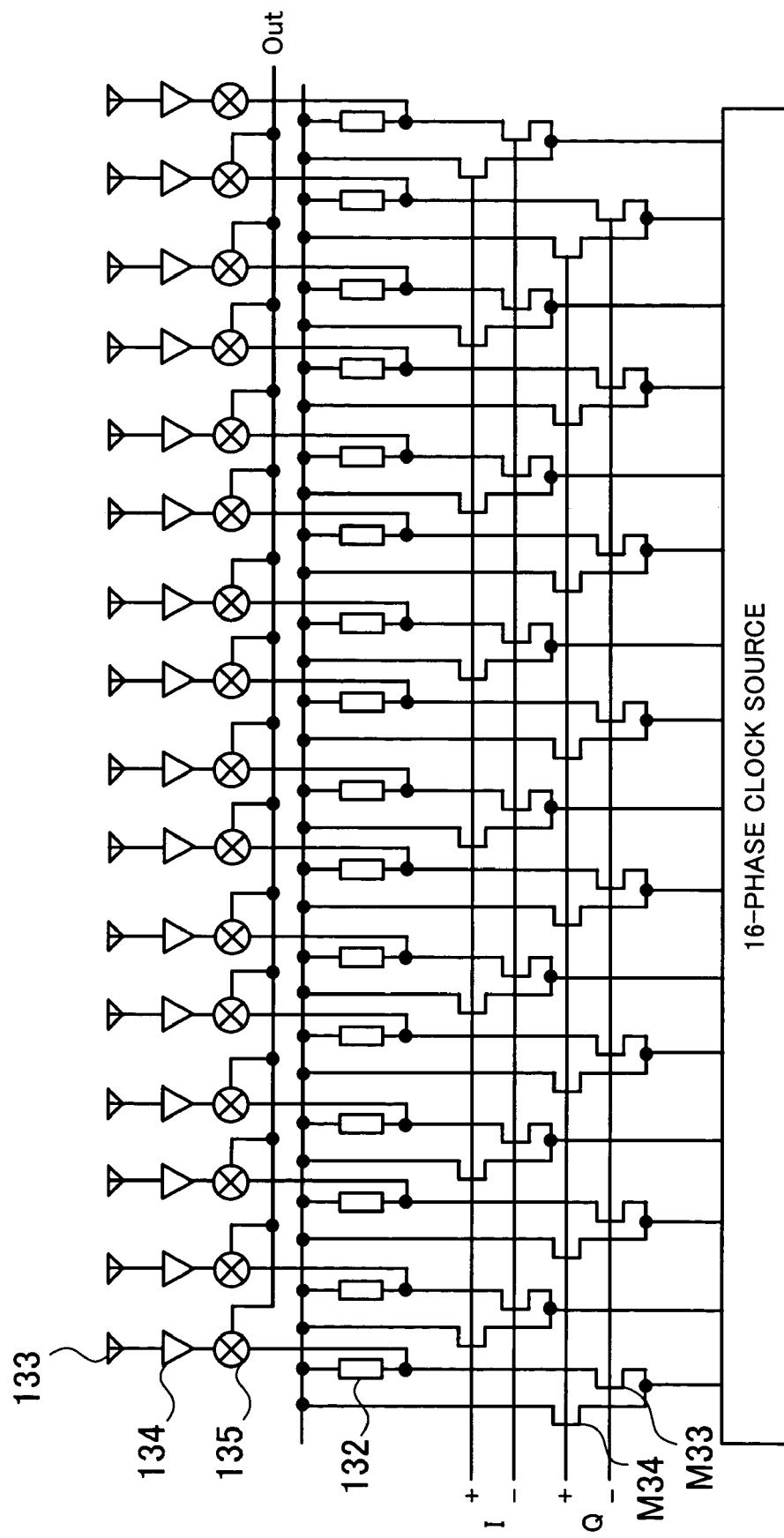
FIG. 26 is a circuit diagram of a quadrature modulation receiving circuit.
Figure 27:
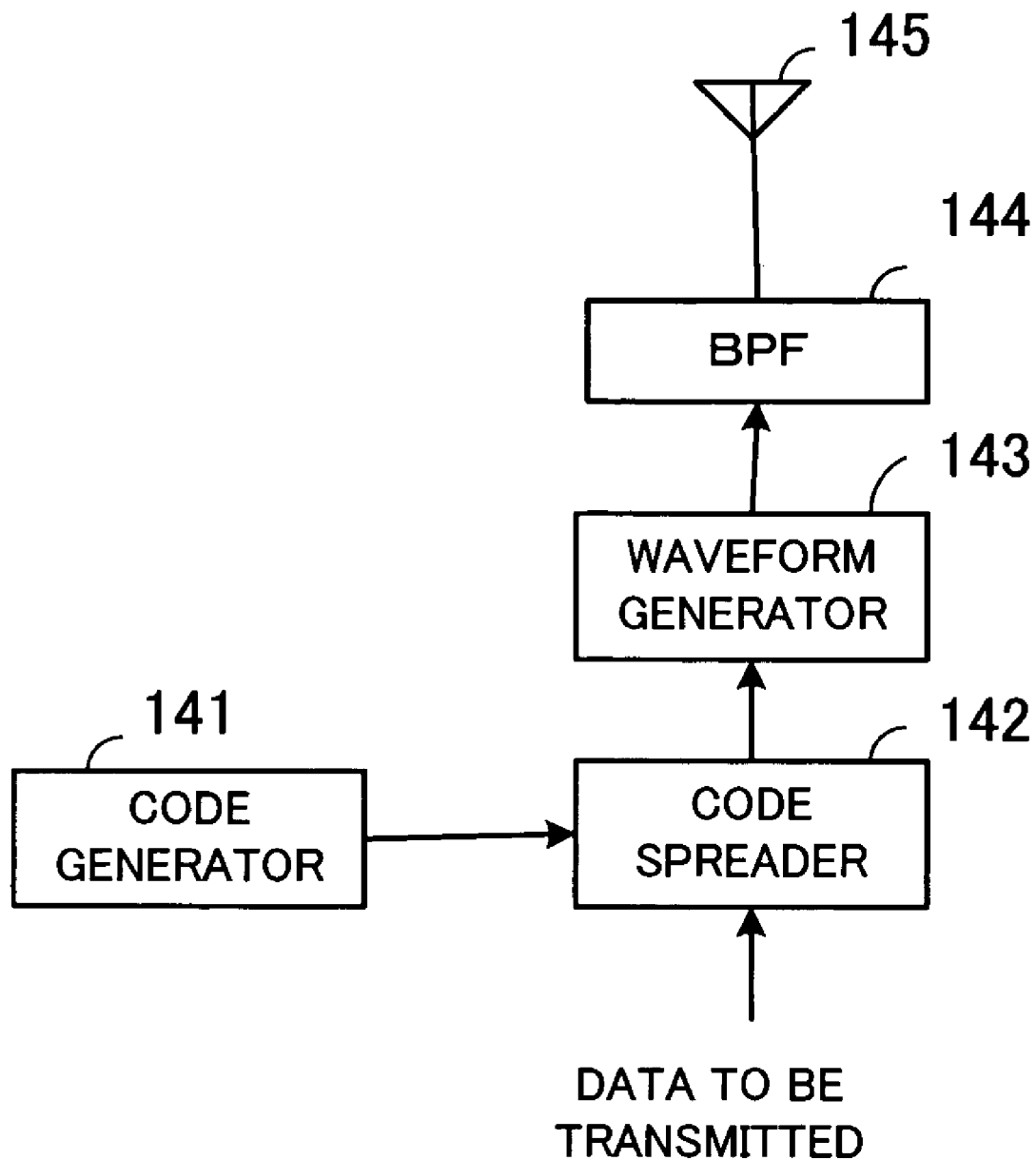
FIG. 27 is a block diagram of a UWB transmitter for performing direct sequence spread spectrum communication.
Figure 28:
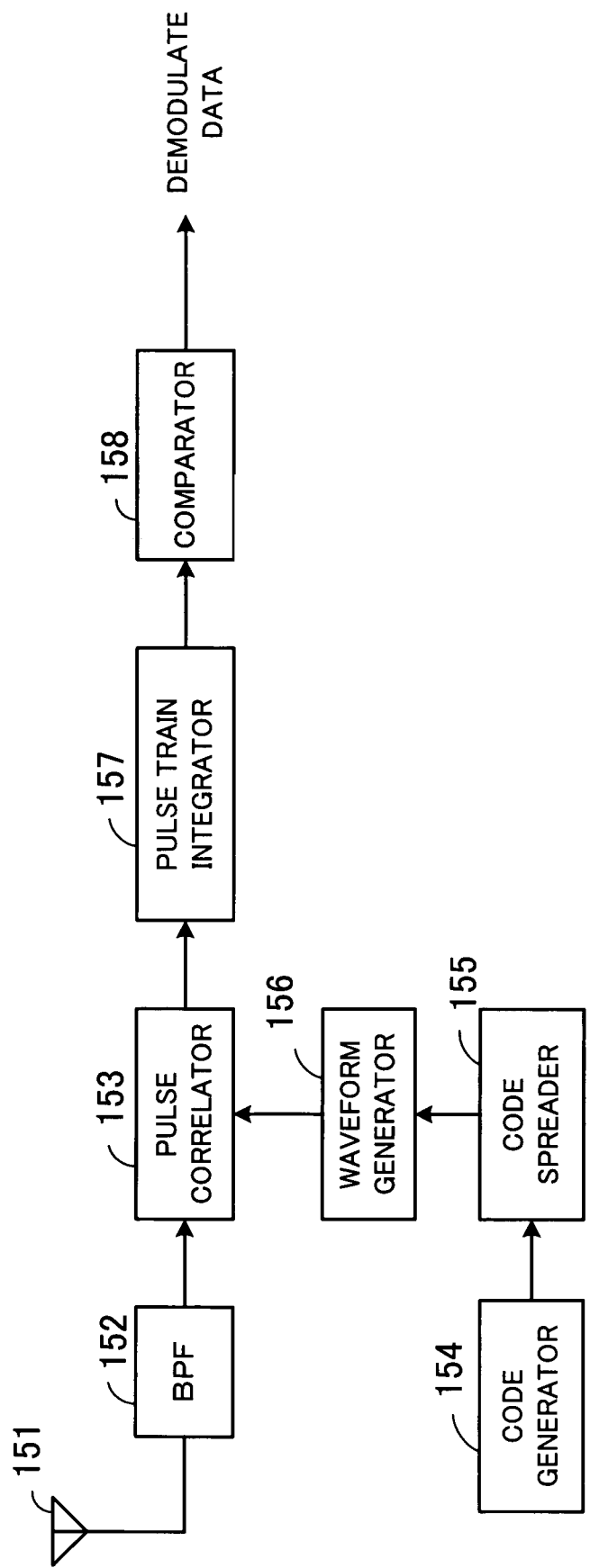
FIG. 28 is a block diagram of a UWB receiver for performing direct sequence spread spectrum communication.

FIG. 26 is a circuit diagram of a quadrature modulation receiving circuit.

A 16-phase clock source 131 shown in FIG. 26 is the same as the 16-phase clock source 121 shown in FIG. 25. As shown in FIG. 26, sources of transistors M33 and M34 are connected to one output terminal of the 16-phase clock source 131. A mixer 135, an amplifier 134, and an antenna 133 are connected in series and the mixer is connected to a drain of the transistor M33. A power supply is connected to a drain of the transistor M34. A stub 132 which is the same as the stub 122 shown in FIG. 25 is connected between the mixer 135 and the power supply. Transistors which are the same as the transistors M33 and M34, a stub which is the same as the stub 132, a mixer which is the same as the mixer 135, an amplifier which is the same as the amplifier 134, and an antenna which is the same as the antenna 133 are connected to each output terminal of the 16-phase clock source 131.

A signal Q with which the correlation of the code-spread data described in FIG. 25 is detected is inputted to gates of the transistors M33 and M34. A negative current pulse is sent to the stub 132 in response to the signal Q. A short wave train at a frequency of 62.5 GHz generated at the end of the stub 132 is outputted to the mixer 135. On the other hand, the signal received by the antenna 133 is amplified at need by the amplifier 134 and is outputted to the mixer 135. The mixer 135 detects a correlation between the signal received by the antenna 133 and the signal outputted from the stub 132 and outputs it. By integrating the sum total of signals outputted from the mixer 135 over a code period, received data after quadrature demodulation and despreading can be obtained. As described above, radio communication can also be performed by using the circuits shown in FIGS. 25 and 26.

In the transmitter in the communication system according to the present invention, one of a plurality of transmitting-end synchronizing signals with different phases is selected and a radio signal is transmitted in synchronization with the selected transmitting-end synchronizing signal. In the receiver, one of a plurality of receiving-end synchronizing signals with different phases is selected and the radio signal is received in synchronization with the selected receiving-end synchronizing signal. As a result, even if a data transmission rate is high, there is no need to increase the frequencies of transmitting-end and receiving-end synchronizing signals. Therefore, circuits can be realized easily and power consumption can be reduced.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A communication system for performing radio communication, the system comprising:
   a transmitter including:
      a code spreader for performing code spreading on data to be transmitted;
      a transmitting-end synchronizing signal generator for generating a plurality of transmitting-end synchronizing signals with different phases on which the timing of the outputting of a radio signal of a single cycle pulse is based;
      a transmitting-end synchronizing signal selector for selecting one of the plurality of transmitting-end synchronizing signals on the basis of the code-spread data to be transmitted; and
      a transmitting-end signal output unit for outputting the radio signal of the single cycle pulse at timing of synchronization with the selected transmitting-end synchronizing signal; and
   a receiver including:
      a code output unit for outputting a despreading code for performing despreading on the radio signal;
      a receiving-end synchronizing signal generator for generating a plurality of receiving-end synchronizing signals which are the same as the plurality of transmitting-end synchronizing signals;
      a receiving-end synchronizing signal selector for selecting one of the plurality of receiving-end synchronizing signals on the basis of the despreading code;
      a receiving-end signal output unit for outputting a correlation-detected signal of a single cycle pulse with which the correlation of the radio signal is detected at timing of synchronization with the selected receiving-end synchronizing signal; and
      a correlator for detecting a correlation between the radio signal and the correlation-detected signal; and
   a convolver for performing code spreading on the data to be transmitted and detecting a correlation between the radio signal transmitted from the transmitter and the correlation-detected signal outputted from the receiving-end signal output unit, the convolver including:
      a semiconductor on which conductive regions are formed like stripes perpendicularly to a direction in which a surface acoustic wave travels;
      an electrode for converting an electrical signal provided to a surface of the semiconductor into the surface acoustic wave; and
      an integrator for integrating the sum total of the products of voltage applied to the conductive regions and the surface acoustic wave which passes through the conductive regions over a certain period of time, and for outputting a result.

2. The communication system according to claim 1, wherein the electrode is a metal film formed on a ferroelectric formed on the surface of the semiconductor or in a recess portion formed in the semiconductor by etching so that the metal film will face the surface of the ferroelectric.

3. The communication system according to claim 1, wherein the electrode is a metal film pattern in the shape of a comb formed on the surface of the semiconductor having a piezoelectric effect.

4. The communication system according to claim 1, wherein:
   the electrode is formed in the center of the conductive regions; and
   a positive signal is provided to the conductive regions on one side and a negative signal is provided to the conductive regions on the other side.

5. A communication system for performing radio communication, the system comprising:
   a transmitter including:
      a code spreader for performing code spreading on data to be transmitted;
      a transmitting-end synchronizing signal generator for generating a plurality of transmitting-end synchronizing signals with different phases on which the timing of the outputting of a radio signal of a single cycle pulse is based;
      a transmitting-end synchronizing signal selector for selecting one of the plurality of transmitting-end synchronizing signals on the basis of the code-spread data to be transmitted;
      a transmitting-end signal output unit for outputting the radio signal of the single cycle pulse at timing of synchronization with the selected transmitting-end synchronizing signal;
      a plurality of transmitting antennas for transmitting the radio signal;
      a signal output section for outputting the radio signal in order with timing which differs among the plurality of transmitting antennas; and
      a transmitting-end phase distributor for outputting the radio signals with different phases to the plurality of transmitting antennas respectively; and
   a receiver including:
      a code output unit for outputting a despreading code for performing despreading on the radio signal;
      a receiving-end synchronizing signal generator for generating a plurality of receiving-end synchronizing signals which are the same as the plurality of transmitting-end synchronizing signals;
      a receiving-end synchronizing signal selector for selecting one of the plurality of receiving-end synchronizing signals on the basis of the despreading code;
      a receiving-end signal output unit for outputting a correlation-detected signal of a single cycle pulse with which the correlation of the radio signal is detected at timing of synchronization with the selected receiving-end synchronizing signal;
      a correlator for detecting a correlation between the radio signal and the correlation-detected signal;
      a plurality of receiving antennas for receiving the radio signal;
      a detection section for detecting the timing of the radio signal received by each of the plurality of receiving antennas; and
      a receiving-end phase distributor for outputting receiving template signals with different phases with which the correlations of the radio signals received by the plurality of receiving antennas are detected,
   wherein each of the transmitting-end phase distributor and the receiving-end phase distributor includes a plurality of common-gate type Colpitts oscillators gate electrodes of which are connected to one another via resistors.

* * * * *